US012489056B2

(12) United States Patent
Lee et al.

(10) Patent No.: US 12,489,056 B2
(45) Date of Patent: Dec. 2, 2025

(54) SEMICONDUCTOR DEVICE HAVING AN UPPER END OF A LOWER SPACER STRUCTURE ON A LEVEL SAME AS OR LOWER THAN A LOWER END OF A STORAGE NODE CONTACT

(71) Applicant: Samsung Electronics Co., Ltd., Suwon-si (KR)

(72) Inventors: Kiseok Lee, Hwaseong-si (KR); Chansic Yoon, Suwon-si (KR); Keunnam Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 394 days.

(21) Appl. No.: 18/062,811

(22) Filed: Dec. 7, 2022

(65) Prior Publication Data

US 2023/0253318 A1 Aug. 10, 2023

(30) Foreign Application Priority Data

Feb. 7, 2022 (KR) .................. 10-2022-0015506

(51) Int. Cl.
 *H10B 12/00* (2023.01)
 *H01L 23/528* (2006.01)
(52) U.S. Cl.
 CPC ....... *H01L 23/5283* (2013.01); *H10B 12/315* (2023.02); *H10B 12/482* (2023.02); *H10B 12/485* (2023.02); *H10B 12/488* (2023.02)
(58) Field of Classification Search
 CPC .. H10B 12/0335; H10B 12/315; H10B 12/34; H10B 12/482; H10B 12/485; H10B 12/488; G11C 8/14; G11C 11/4097
 (Continued)

(56) References Cited

U.S. PATENT DOCUMENTS 8,580,669 B2 11/2013 Kim
8,878,293 B2 11/2014 Jang et al.
(Continued)

FOREIGN PATENT DOCUMENTS

KR 10-2014-0052225 A 5/2014
KR 2014/0108951 A 9/2014

OTHER PUBLICATIONS

Taiwanese Office Action dated Sep. 21, 2023 for corresponding Taiwanese Patent Application No. TW-111148025.
(Continued)

*Primary Examiner* — Hoai V Pham
(74) *Attorney, Agent, or Firm* — Fish & Richardson P.C.

(57) ABSTRACT

A semiconductor device includes a substrate including an active region, a word line structure, a bit line structure on the substrate, and a bit line contact pattern configured to electrically connect a first impurity region of the active region with the bit line structure. The device includes a storage node contact on a side wall of the bit line structure, and the storage node contact is electrically connected to a second impurity region of the active region. The device includes a spacer structure on a side wall of the bit line structure, the spacer structure on a side wall of the bit line contact pattern, the spacer structure including a lower spacer structure surrounding a side surface of the lower portion, and an upper spacer structure disposed on a side surface of the upper portion. The device includes a capacitor structure electrically connected to the storage node contact.

20 Claims, 19 Drawing Sheets

(58) Field of Classification Search
USPC .................................................. 257/906, 908
See application file for complete search history.

(56) References Cited

U.S. PATENT DOCUMENTS

| | | |
|---|---|---|
| 9,209,241 B2 | 12/2015 | Kim et al. |
| 9,564,442 B2 | 2/2017 | Tang et al. |
| 10,910,386 B2 | 2/2021 | Hsu et al. |
| 2020/0083224 A1* | 3/2020 | Chang .................... H10B 12/05 |
| 2021/0134809 A1 | 5/2021 | Son et al. |
| 2021/0296237 A1 | 9/2021 | Kim et al. |

OTHER PUBLICATIONS

Office Action in Korean Appln. No. 10-2022-0015506, mailed on Sep. 22, 2025, 12 pages (with English translation).

* cited by examiner

'A'

SEMICONDUCTOR DEVICE HAVING AN UPPER END OF A LOWER SPACER STRUCTURE ON A LEVEL SAME AS OR LOWER THAN A LOWER END OF A STORAGE NODE CONTACT

CROSS-REFERENCE TO RELATED APPLICATION

This application claims benefit of priority to Korean Patent Application No. 10-2022-0015506 filed on Feb. 7, 2022 in the Korean Intellectual Property Office, the disclosure of which is incorporated herein by reference in its entirety.

BACKGROUND

One or more example embodiments relate to a semiconductor device.

With the development of the electronics industry and the needs of users, electronic devices have been becoming smaller in size and higher in performance. Accordingly, semiconductor devices used for electronic devices are also desired or required to have high degrees of integration and high performance. In order to manufacture a high-performance semiconductor device, there is a demand for a technology for forming a spacer structure optimized to space adjacent conductive structures apart from each other.

SUMMARY

Some example embodiments provide a semiconductor device having improved electrical characteristics.

According to some example embodiments of the inventive concepts, a semiconductor device includes a substrate including an active region, a word line structure extending in a first horizontal direction, and a bit line structure on the substrate, the bit line structure extending in a second horizontal direction, and the second horizontal direction intersecting the first horizontal direction. The device includes a bit line contact pattern configured to electrically connect a first impurity region of the active region with the bit line structure, the bit line contact pattern including a lower portion and an upper portion, and the upper portion having a width narrower than a width of the lower portion in the first horizontal direction. The device includes a storage node contact on a side wall of the bit line structure, and the storage node contact is electrically connected to a second impurity region of the active region. The device includes a spacer structure on a side wall of the bit line structure, the spacer structure on a side wall of the bit line contact pattern, the spacer structure including a lower spacer structure surrounding a side surface of the lower portion, the spacer structure including an upper spacer structure disposed on a side surface of the upper portion, the side wall of the bit line structure on the lower spacer structure, and an upper end of the lower spacer structure on a level same as or lower than a level of a lower end of the storage node contact. The device includes a capacitor structure electrically connected to the storage node contact.

According to another example embodiment of the inventive concepts, a semiconductor device includes a substrate including an active region, a word line structure extending in a first horizontal direction in the substrate, a plurality of conductive pads on the substrate, an insulating pattern configured to space the plurality of conductive pads apart from each other, and a bit line structure on the plurality of conductive pads and the insulating pattern, the bit line structure extending in a second horizontal direction, the second horizontal direction intersecting the first horizontal direction. The device includes a bit line contact pattern configured to electrically connect a first impurity region of the active region with the bit line structure, and a storage node contact on a side wall of the bit line structure, the storage node contact in contact with the plurality of conductive pads and electrically connected to a second impurity region of the active region. The device includes a spacer structure on a side wall of the bit line structure and on a side wall of the bit line contact pattern, the spacer structure including a lower spacer structure surrounding a portion of a side surface of the bit line contact pattern, the spacer structure including an upper spacer structure between the storage node contact and the bit line structure, and an upper end of the lower spacer structure on a level lower than a level of upper surfaces of the plurality of conductive pads. The device includes a capacitor structure electrically connected to the storage node contact.

According to another example embodiment of the inventive concepts, a semiconductor device includes a plurality of conductive pads on a substrate, an insulating pattern configured to pass through the plurality of conductive pads and space the plurality of conductive pads from each other, a bather pattern on the plurality of conductive pads and the insulating pattern, and a bit line contact pattern configured to pass through the plurality of conductive pads and the insulating pattern on the substrate, the bit line contact pattern electrically connected to the substrate. The device includes a storage node contact in contact with the plurality of conductive pads, a lower spacer structure configured to space the bit line contact pattern and the plurality of conductive pads apart from each other, an upper end of the lower spacer structure on a level lower than a level of upper surfaces of the plurality of conductive pads, and an upper spacer structure configured to space the bit line contact pattern and the storage node contact apart from each other.

BRIEF DESCRIPTION OF DRAWINGS

The above and other example embodiments of the inventive concepts will be more clearly understood from the following detailed description, taken in conjunction with the accompanying drawings, in which.

DETAILED DESCRIPTION

Hereinafter, some example embodiments are described with reference to the accompanying drawings.

Figure 1:
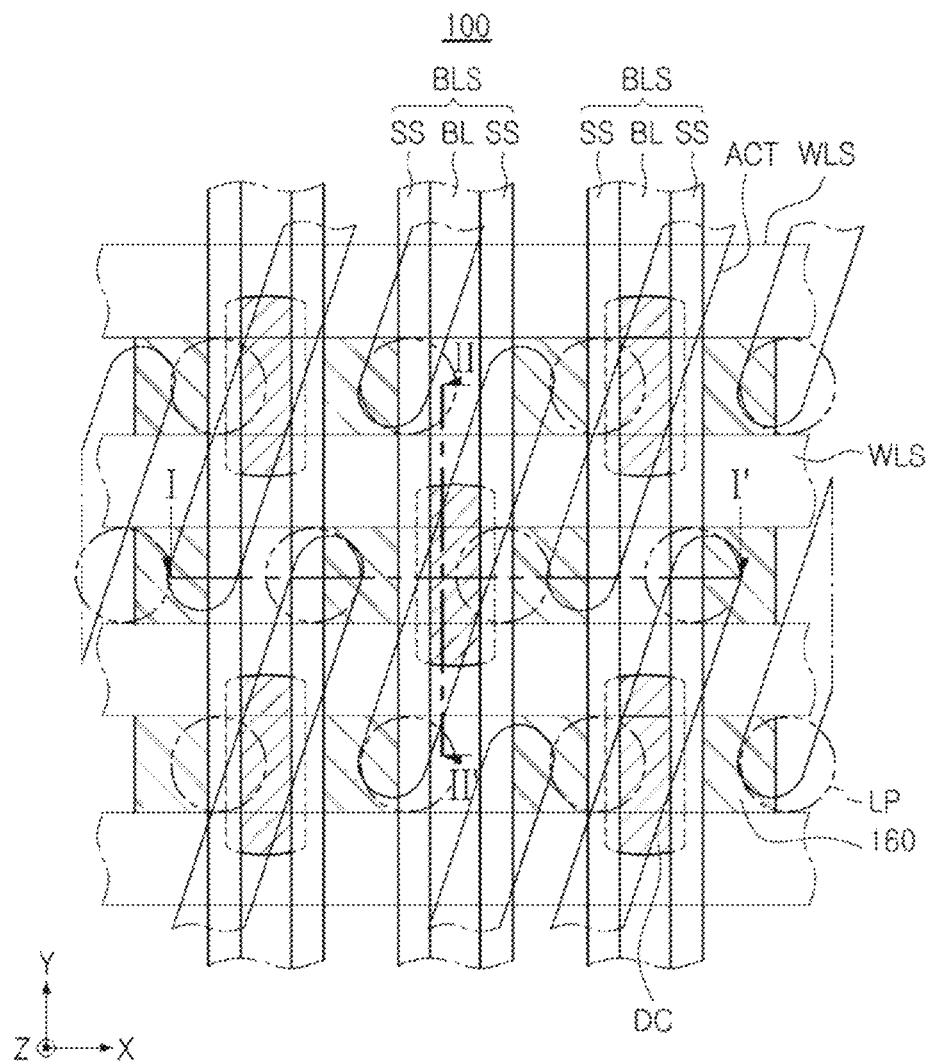
FIG. 1 is a schematic plan view of a semiconductor device according to some example embodiments.

FIG. 1 is a schematic plan view of a semiconductor device according to some example embodiments.

Figure 2:
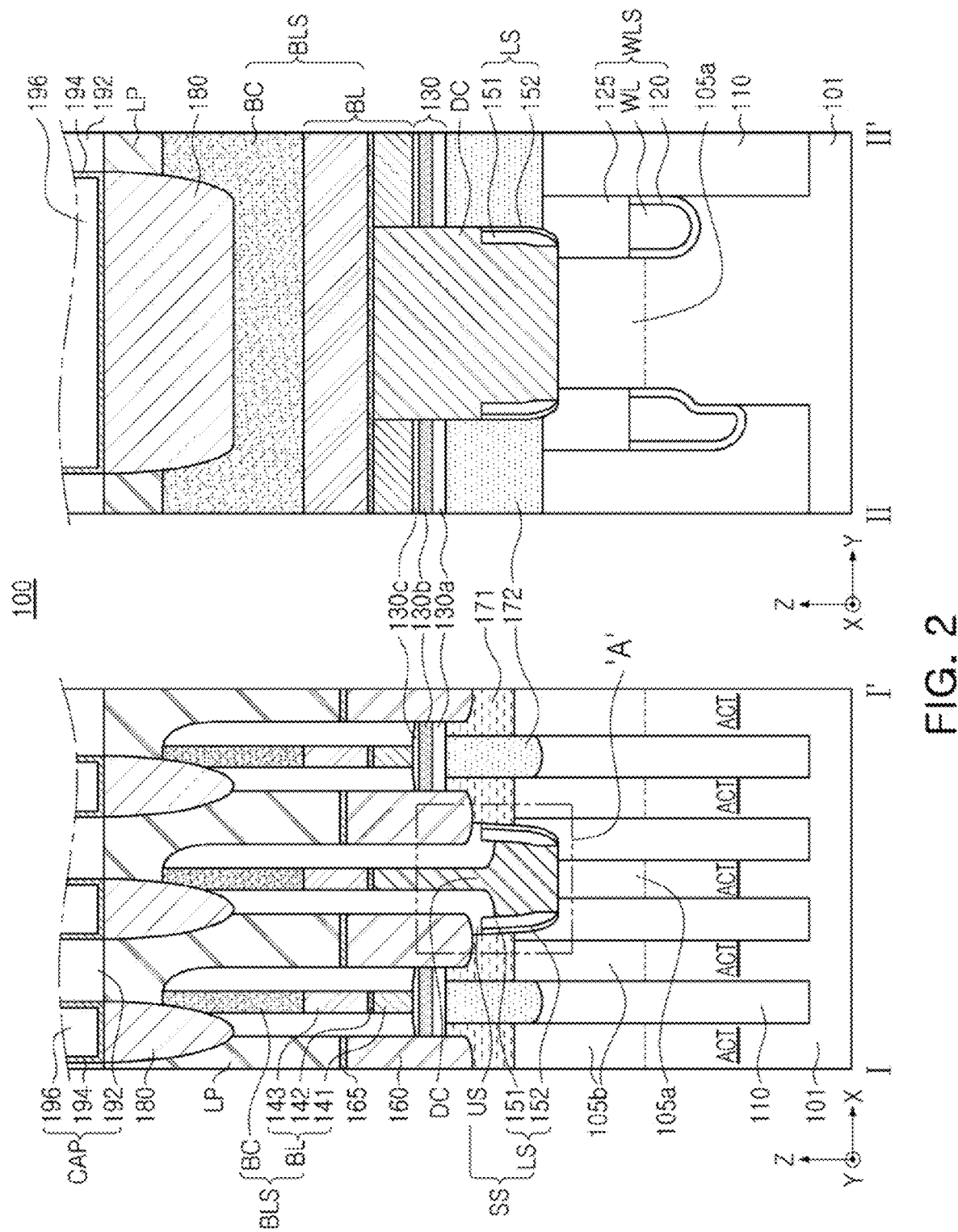
FIG. 2 is a schematic cross-sectional view of a semiconductor device according to some example embodiments.

FIG. 2 is a schematic cross-sectional view of a semiconductor device according to some example embodiments. FIG. 2 is a cross-sectional view taken along cut lines I-I' and II-II' of FIG. 1.

Figure 3:
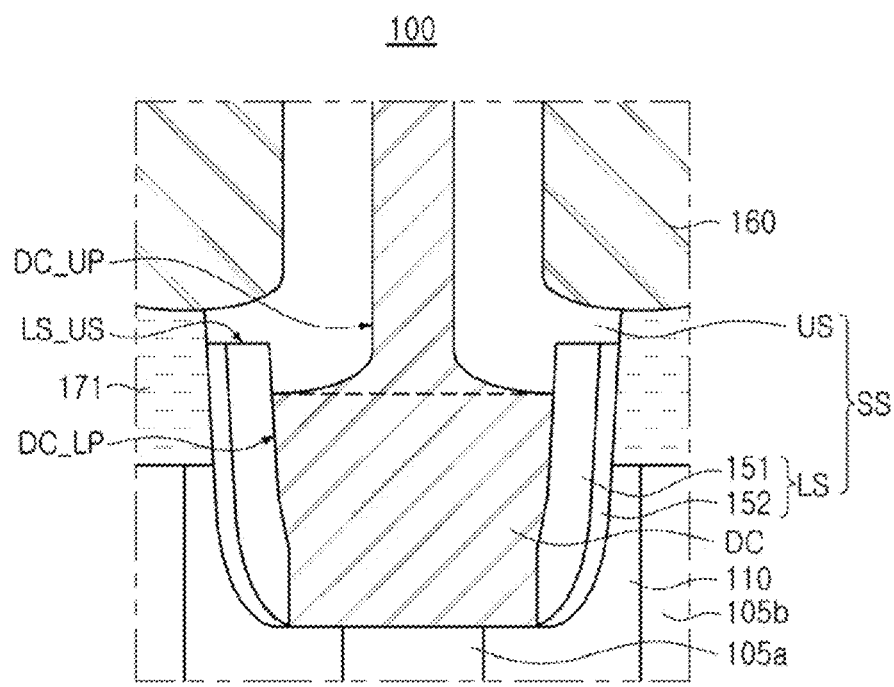
FIG. 3 is a partially enlarged cross-sectional view of a semiconductor device according to some example embodiments.

FIG. 3 is a partially enlarged cross-sectional view of a semiconductor device according to some example embodiments. FIG. 3 illustrates an enlarged view of area "A" of FIG. 2.

Referring to FIGS. 1 to 3, a semiconductor device 100 may include a substrate 101 including an active region ACT, a word line structure WLS buried in the substrate 101 and extending therein, the word line structure WLS including a word line WL, a bit line structure BLS extending to intersect the word line structure WLS on the substrate 101, the bit line structure BLS including a bit line BL, spacer structures SS on opposite sides of the bit line structure BLS, a capacitor structure CAP disposed on an upper portion of the bit line structure BLS, a bit line contact pattern DC electrically connecting the bit line structure BLS and the active region ACT to each other, a storage node contact 160 electrically connecting the capacitor structure CAP and the active region ACT to each other, a landing pad LP electrically connecting the storage node contact 160 and capacitor structures CAP to each other, and a capping insulating layer 180 disposed on bit line structures BLS. The semiconductor device 100 may further include device isolation layers 110 defining the active region ACT, a barrier pattern 130 on the substrate 101, a metal-semiconductor layer 165 on the storage node contact 160, and insulating patterns between the bit line structures BLS. The semiconductor device 100 may be applied to, for example, a cell array of a dynamic random access memory (DRAM), but example embodiments are not limited thereto.

The substrate 101 may have an upper surface extending in an x direction and a y direction. The substrate 101 may include a semiconductor material, such as a group IV semiconductor, a group III-V compound semiconductor, or a group II-VI compound semiconductor, but example embodiments are not limited thereto. For example, the group IV semiconductor may include silicon, germanium, or silicon-germanium. The substrate 101 may be a silicon substrate, a silicon-on-insulator (SOI) substrate, a germanium substrate, a germanium-on-insulator (GOT) substrate, a silicon-germanium substrate, or a substrate including an epitaxial layer, but example embodiments are not limited thereto.

The active region ACT may be defined by the device isolation layers 110. The active region ACT may have a bar shape, and may be disposed in the substrate 101 to have an island shape extending in a direction, for example, a W direction. The W direction may be a direction inclined with respect to extending directions of the word line WL and the bit line BL. The active region ACT may intersect the bit line structure BLS and/or the word line structure WLS.

The active region ACT may include first and second impurity regions 105a and 105b having a desired (or, alternatively predetermined) depth from an upper surface of the substrate 101. The first and second impurity regions 105a and 105b may be spaced apart from each other. The first and second impurity regions 105a and 105b may serve as source and drain regions of a transistor. For example, a drain region may be formed between two word lines WL intersecting one active region ACT, and a source region may be formed outside each of the two word lines WL. The source region and the drain region, which are formed by the first and second impurity regions 105a and 105b by doping or ion implantation with substantially the same impurities, may be interchangeably referred to depending on a circuit configuration of a finally formed transistor. The impurities may include dopants having a conductivity type opposite to that of the substrate 101. In some example embodiments, in the source region and the drain region, depths of the first and second impurity regions 105a and 105b may be different from each other.

The device isolation layers 110 may be formed by a shallow trench isolation (STI) process. The device isolation layers 110 may be a field region surrounding the active region ACT and spacing portions of the active region ACT apart from each other. The device isolation layers 110 may be made of an insulating material, for example, oxide, nitride, or a combination thereof. In an example embodiment, each of the device isolation layers 110 may include a plurality of layers.

Each of the word line structures WLS may include a gate dielectric layer 120, the word line WL, and a buried insulating layer 125.

The word line WL may be disposed in gate trenches extending in the substrate 101. The word line WL may be disposed to extend in a direction across the active region ACT in the substrate 101, for example, an X-direction. For example, a pair of word lines WL may be disposed to intersect one active region ACT. Transistors including the word line WL and the first and second impurity regions 105a and 105b may be included in a buried channel array transistor (BCAT), but example embodiments are not limited thereto.

The word line WL may be disposed on lower portions of the gate trenches to have a desired (or, alternatively predetermined) thickness. An upper surface of the word line WL may be positioned on a level lower than that of the upper surface of the substrate 101. Herein, high and low of the term "level" may be defined based on a substantially flat upper surface of the substrate 101. The word line WL may include a conductive material, for example, at least one of polycrystalline silicon (Si), titanium (Ti), titanium nitride (TiN), tantalum (Ta), tantalum nitride (TaN), tungsten (W), tungsten nitride (WN), and aluminum (Al), but example embodiments are not limited thereto. In some example embodiments, the word line WL may include a plurality of layers.

The gate dielectric layer 120 may be disposed on bottom surfaces and inner side surfaces of the gate trenches. The gate dielectric layer 120 may conformally cover inner side walls of the gate trenches. The gate dielectric layer 120 may be disposed between the word line WL and the active region ACT. The gate dielectric layer 120 may include at least one of an oxide, a nitride, and an oxynitride. The gate dielectric layer 120 may be, for example, a silicon oxide film or an insulating film having a high dielectric constant. In example embodiments, the gate dielectric layer 120 may be a layer formed by oxidizing the active region ACT or a layer formed by deposition.

The buried insulating layer 125 may be disposed on the word line WL and may fill the gate trenches. The buried insulating layer 125 may include an insulating material, for example, silicon nitride.

In an example embodiment, the semiconductor device 100 may include a plurality of conductive pads 171 disposed on the substrate 101, and an insulating pattern 172 spacing the plurality of conductive pads 171 apart from each other. Each of the plurality of conductive pads 171 may be electrically connected to the active region ACT. Lower surfaces of the plurality of conductive pads 171 may be in direct contact with an upper surface of the active region ACT. Each of the plurality of conductive pads 171 may electrically connect the storage node contact 160 and the second impurity region 105*b* to each other. The plurality of conductive pads 171 may include silicon having an N-type conductivity. For example, the plurality of conductive pads 171 may include single crystal silicon formed by selective epitaxial growth (SEG). In another example embodiment, the plurality of conductive pads 171 may include polysilicon. The insulating pattern 172 may surround, between the plurality of conductive pads 171, each of the conductive pads 171. The insulating pattern 172 may pass through the plurality of conductive pads 171 to electrically isolate the plurality of conductive pads 171 from each other. The insulating pattern 172 may include an insulating material different from those of the device isolation layers 110. The insulating material may be, for example, silicon nitride. In an example embodiment, the insulating pattern 172 may be recessed deeper than the lower surfaces of the plurality of conductive pads 171 to have a lower surface on a level lower than that of the lower surfaces of the plurality of conductive pads 171, but example embodiments are not limited thereto. Upper surfaces of the plurality of conductive pads 171 and an upper surface of the insulating pattern 172 may be positioned on substantially the same level. However, in some example embodiments, the plurality of conductive pads 171 and the insulating pattern 172 may be omitted.

The barrier pattern 130 may be disposed on the substrate 101. The barrier pattern 130 may be disposed between the substrate 101 and the bit line structure BLS. In an example embodiment, the barrier pattern 130 may be disposed on the plurality of conductive pads 171 and the insulating pattern 172. In some example embodiments, a lower surface of the barrier pattern 130 may be in contact with the upper surfaces of the plurality of conductive pads 171 and the upper surface of the insulating pattern 172. The storage node contact 160 may pass through the barrier pattern 130 to be electrically connected to the active region ACT. The storage node contact 160 may pass through the barrier pattern 130 to be in contact with the plurality of conductive pads 171. The barrier pattern 130 may include an insulating material, for example, silicon oxide, silicon nitride, silicon oxynitride, or a combination thereof, but example embodiments are not limited thereto.

In an example embodiment, the barrier pattern 130 may include a first barrier pattern 130*a*, a second barrier pattern 130*b*, and a third barrier pattern 130*c*. For example, the first barrier pattern 130*a* may include silicon oxide, the second barrier pattern 130*b* may include silicon nitride, and the third barrier pattern 130*c* may include silicon oxide. However, in some example embodiments, the barrier pattern 130 may include various numbers of layers unlike three layers illustrated in the drawing, or may include a different material.

The bit line structure BLS may extend in a direction perpendicular to the word line WL, for example, in the y direction. The bit line structure BLS may include the bit line BL and a bit line capping pattern BC on the bit line.

The bit line BL may include a first conductive pattern 141, a second conductive pattern 142, and a third conductive pattern 143 that are sequentially stacked. The bit line capping pattern BC may be disposed on the third conductive pattern 143. The barrier pattern 130 may be disposed between the first conductive pattern 141 and the substrate 101. The first conductive pattern 141 may be in contact with the barrier pattern 130 on the barrier pattern 130. The first conductive pattern 141 may include a semiconductor material such as polycrystalline silicon. The second conductive pattern 142 may include a metal-semiconductor compound. The metal-semiconductor compound may be, for example, a layer formed by performing silicidation on a portion of the first conductive pattern 141. For example, the metal-semiconductor compound may include cobalt silicide (CoSi), titanium silicide (TiSi), nickel silicide (NiSi), tungsten silicide (WSi), or other metal silicides, but example embodiments are not limited thereto. The third conductive pattern 143 may include metal materials such as Ti, Ta, W, and Al. In some example embodiments, the number of conductive patterns included in the bit line BL, a type of material, and/or a stacking order may be changed in various ways.

The bit line capping pattern BC may include a first capping pattern, a second capping pattern, and a third capping pattern that are sequentially stacked on the third conductive pattern 143. Each of the first to third capping patterns may include an insulating material, for example, a silicon nitride film. The first to third capping patterns may be made of different materials, and may be distinguished from each other due to a difference in physical properties even when the first to third capping patterns include the same or substantially the same material. A thickness of the second capping pattern may be less than each of a thickness of the first capping pattern and a thickness of the third capping pattern. In some example embodiments, the number of capping patterns included in the bit line capping pattern BC and/or a type of material may be changed in various manners.

The bit line contact pattern DC may have an upper surface on a level the same or substantially the same as that of the first conductive pattern 141, and may be in contact with the second conductive pattern 142. The bit line contact pattern DC may pass through the barrier pattern 130 to be in contact with the first impurity region 105*a* of the active region ACT. The bit line BL may be electrically connected to the first impurity region 105*a* through the bit line contact pattern DC. A lower surface of the bit line contact pattern DC may be positioned on a level lower than that of the upper surface of the substrate 101, and may be positioned on a level higher than that of the upper surface of the word line WL.

In an example embodiment, the bit line contact pattern DC may be spaced apart from the plurality of conductive pads 171 and the storage node contact 160 by the spacer structures SS.

In an example embodiment, the bit line contact pattern DC may include a lower portion DC_LP having a first width in the x direction, and an upper portion DC_UP disposed on the lower portion DC_LP and having a second width narrower than the first width in the x direction. Herein, "width" may refer to a maximum width or average width of a corresponding portion. The lower portion DC_LP may be a portion where a portion of the bit line contact pattern DC remains without being etched in a process of forming the bit line contact pattern DC as the semiconductor device is highly integrated.

The spacer structures SS may include a lower spacer structure LS surrounding a portion of a side surface of the bit line contact pattern DC, and an upper spacer structure US disposed on opposite side walls of each of the bit line structures BLS, the upper spacer structure US extending in a direction, for example, the Y-direction.

The lower spacer structure LS may isolate the bit line contact pattern DC and the plurality of conductive pads 171 from each other.

The lower spacer structure LS may surround a side surface of the lower portion DC_LP of the bit line contact pattern DC. An upper surface LS_US of the lower spacer structure LS may be positioned on a level lower than those of the upper surfaces of the plurality of conductive pads 171. In an example embodiment, the upper surface LS_US of the lower spacer structure LS may be positioned on a level higher than those of the lower surfaces of the plurality of conductive pads 171. However, in some example embodiments, an upper surface of the lower spacer structure LS may be positioned on a level lower than those of the lower surfaces of the plurality of conductive pads 171.

The lower spacer structure LS may have a portion extending from between the lower portion DC_LP and the plurality of conductive pads 171 along side surfaces of the plurality of conductive pads 171. The extending portion of the lower spacer structure LS may be positioned on a level higher than that of an upper surface of the lower portion DC_LP of the bit line contact pattern DC. Accordingly, an upper end of the lower spacer structure LS may be positioned on a level higher than that of the lower portion DC_LP. Herein, an "upper end" may refer to a portion positioned at a highest level among components.

In an example embodiment, the lower spacer structure LS may include a first lower spacer 151 surrounding the lower portion DC_LP and a second lower spacer 152 surrounding an outer side surface of the first lower spacer 151.

The lower spacer structure LS may include an insulating material, for example, silicon oxide, silicon nitride, silicon oxynitride, a low-k material, or a combination thereof, but example embodiments are not limited thereto. In an example embodiment, the first lower spacer 151 may include silicon oxide, and the second lower spacer 152 may include silicon nitride.

The upper spacer structure US may isolate the storage node contact 160 and the bit line structure BLS from each other on the lower spacer structure LS.

The upper spacer structure US may be disposed to extend along side walls of the bit line BL and side walls of the bit line capping pattern BC. A pair of upper spacer structures US disposed on opposite sides of one bit line structure BLS may have an asymmetrical shape with respect to the bit line structure BLS. The asymmetrical shape may be formed by the capping insulating layer 180.

In an example embodiment, the lower spacer structure LS may be positioned on a level lower than that of a lower end of the storage node contact 160. Accordingly, the lower spacer structure LS may be spaced apart from the storage node contact 160. In some example embodiments, the upper spacer structure US may include a portion extending to a space between the lower spacer structure LS and the storage node contact 160 to space the lower spacer structure LS and the storage node contact 160 apart from each other. The upper spacer structure US may extend to the space to be in contact with the plurality of conductive pads 171. The upper spacer structure US may cover portions of the upper surface and a side surface of the lower spacer structure LS and the upper surface of the lower portion DC_LP of the bit line contact pattern DC. A portion of a lower surface of the upper spacer structure US in contact with the lower spacer structure LS may be positioned on a level higher than that of a portion of the lower surface of the upper spacer structure US in contact with the bit line contact pattern DC. This may be because the upper end of the lower spacer structure LS is positioned on a level higher than that of an upper end of the lower portion DC_LP of the bit line contact pattern DC.

The upper spacer structure US may include an insulating material, for example, silicon oxide or silicon nitride. In an example embodiment, the upper spacer structure US is illustrated as a single layer, but the material of the upper spacer structure US and the number of layers of the upper spacer structure US are not limited thereto, and may be changed to have various forms.

In an example embodiment, the semiconductor device 100 may further include an insulating fence. The insulating fence may be disposed in a spaced manner between a plurality of bit line structures BLS in a direction, for example, in the Y-direction. The insulating fence may overlap the word line structures WLS, when viewed in a plan view. The insulating fence may include, for example, silicon nitride.

The storage node contact 160 may be electrically connected to one area of the active region ACT, for example, the second impurity region 105b. In an example embodiment, the storage node contact 160 may pass through the barrier pattern 130 to be in contact with the plurality of conductive pads 171, and may be electrically connected to the second impurity region 105b through the plurality of conductive pads 171. The storage node contact 160 may electrically connect the capacitor structure CAP and the second impurity region 105b to each other.

In an example embodiment, there may be a plurality of storage node contacts 160. As illustrated in FIG. 1, each of the storage node contacts 160 may be disposed between the bit line structures BLS that are adjacent along the x direction, in particular, between the spacer structures SS on opposite sides of the bit line structures BLS, when viewed in a plan view. When viewed in a plan view, each of the storage node contacts 160 may be disposed between the word line structures WLS and between the bit line structures BLS. Each of the storage node contacts 160 may fill a space defined by the bit line structures BLS that are adjacent in the X-direction and the insulating fence that is adjacent in the Y-direction. The storage node contacts 160 may be disposed in columns and rows along the X-direction and the Y-direction.

The storage node contact 160 may be made of a conductive material, for example, Si, Ti, TiN, Ta, TaN, W, WN, and Al, but example embodiments are not limited thereto. In an example embodiment, the storage node contact 160 may include a plurality of layers.

A lower end of the storage node contact 160 may be positioned on a level higher than that of the lower surface of the bit line contact pattern DC. The lower end of the storage node contact 160 may be positioned on a level higher than that of the lower spacer structure LS. The storage node contact 160 may be insulated from the bit line contact pattern DC by the lower spacer structure LS.

A height of the upper end of the lower spacer structure LS may be relatively lowered by partially removing a portion of the lower spacer structure LS through a process, thereby improving a difficulty level of a contact hole manufacturing process for forming the storage node contact 160. This may be because a space required for the process is increased to correspond to a space secured by removing the portion of lower spacer structure LS. Accordingly, even when a width between the plurality of conductive pads 171 and the bit line contact pattern DC becomes relatively narrower due to high integration of a semiconductor device, the storage node contact 160 may be stably formed.

The lower spacer structure LS may lower a difficulty level of an etching process for forming the storage node contact 160 while isolating the storage node contact 160 and the bit line contact pattern DC from each other, thereby providing a semiconductor device with improved electrical characteristics and production yield.

The metal-semiconductor layer 165 may be disposed between the storage node contact 160 and the landing pad LP. The metal-semiconductor layer 165 may cover an upper surface of the storage node contact 160. The metal-semiconductor layer 165 may be, for example, a layer formed by performing silicidation on a portion of the storage node contact 160. For example, the metal-semiconductor layer 165 may include CoSi, TiSi, NiSi, WSi, or other metal silicides, but example embodiments are not limited thereto. In some example embodiments, the metal-semiconductor layer 165 may be omitted.

The landing pad LP may electrically connect the storage node contact 160 and the capacitor structure CAP to each other.

The landing pad LP may be disposed between a pair of bit line structures BLS and on the storage node contact 160. The landing pad LP may cover an upper surface of the metal-semiconductor layer 165. The landing pad LP may be in contact with side walls of the spacer structures SS. In an example embodiment, the upper spacer structure US may extend from between the bit line structure BLS and the storage node contact 160 to between the bit line structure BLS and the landing pad LP. The landing pad LP may pass through the capping insulating layer 180, and may be in contact with the capping insulating layer 180.

In an example embodiment, there may be a plurality of landing pads LP, and the plurality of landing pads LP may be arranged in a lattice pattern having a hexagonal or honeycomb shape. An arrangement of the plurality of landing pads LP may correspond to an arrangement of the capacitor structures CAP.

In an example embodiment, the landing pad LP may have a double-layer structure including a conductive layer and a barrier layer covering a lower surface and a side surface of the conductive layer. The conductive layer may include a conductive material, for example, at least one of Si, Ti, Ta, W, and Al, and the barrier layer may include a metal nitride, for example, at least one of TiN, TaN, and WN, but example embodiments are not limited thereto. However, in some example embodiments, the number of layers of the landing pad LP and the shape of the landing pad LP may be changed in various ways.

The capping insulating layer 180 may be disposed on the bit line structure BLS. The capping insulating layer 180 may be disposed to be in contact with the bit line structure BLS, the spacer structures SS, and the landing pad LP. In an example embodiment, the capping insulating layer 180 may be disposed between the plurality of landing pads LP. The capping insulating layer 180 may have a lower end in contact with upper surfaces of the spacer structures SS.

The capacitor structure CAP may be disposed on the bit line structure BLS to be in contact with the landing pad LP. The capacitor structure CAP may include a lower electrode 192, a capacitor dielectric layer 194, and an upper electrode 196. The lower electrode 192 and the upper electrode 196 may include at least one of a doped semiconductor, a metal nitride, a metal, and a metal oxide, but example embodiments are not limited thereto. The lower electrode 192 and the upper electrode 196 may include, for example, at least one of polycrystalline silicon, TiN, W, Ti, ruthenium (Ru), and WN. The capacitor dielectric layer 194 may include, for example, at least one of high-k materials such as zirconium oxide (ZrO2), aluminum oxide (Al2O3), and hafnium oxide (Hf2O3). In FIG. 2, the capacitor structure CAP is illustrated to have a pillar shape, but example embodiments are not limited thereto and may have a cylinder shape.

Figure 4:
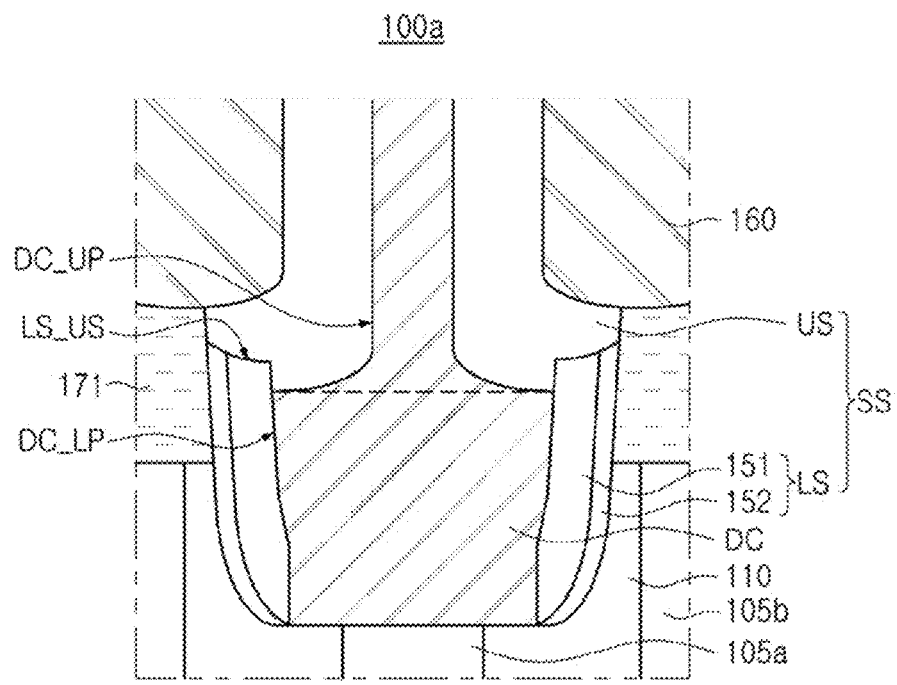
FIG. 4 is a partially enlarged cross-sectional view of a semiconductor device according to some example embodiments.

FIG. 4 is a partially enlarged cross-sectional view of a semiconductor device 100a according to some example embodiments.

Referring to FIG. 4, the upper surface LS_US of the lower spacer structure LS may be positioned on levels that becomes higher in a direction away from the bit line contact pattern DC. Accordingly, the lower spacer structure LS may have an upper end in an area in contact with the plurality of conductive pads 171 and/or the insulating pattern 172, and may have an inclined upper surface.

Figure 10A:
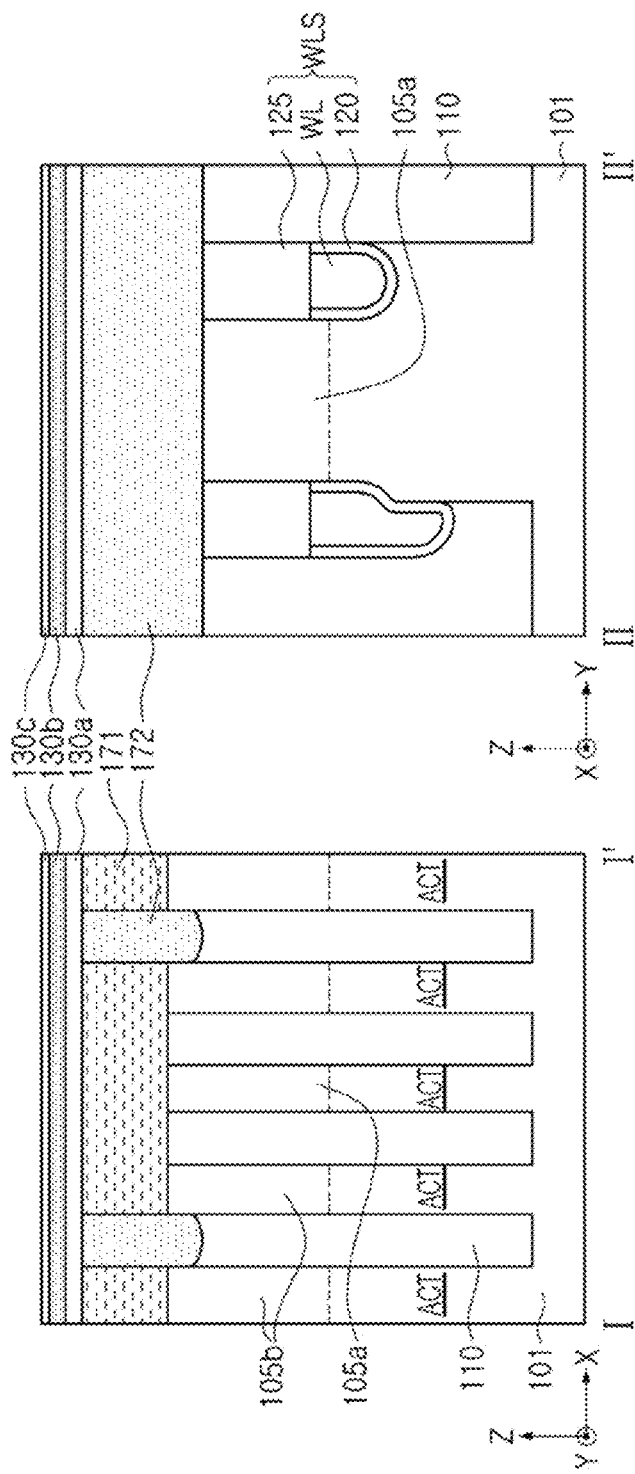
FIGS. 10A, 10B, 10C, 10D, 10E, 10F, 10G, 10H, 10I, 10J to 10K are schematic cross-sectional views illustrating a method of manufacturing a semiconductor device according to some example embodiments.
Figure 10B:
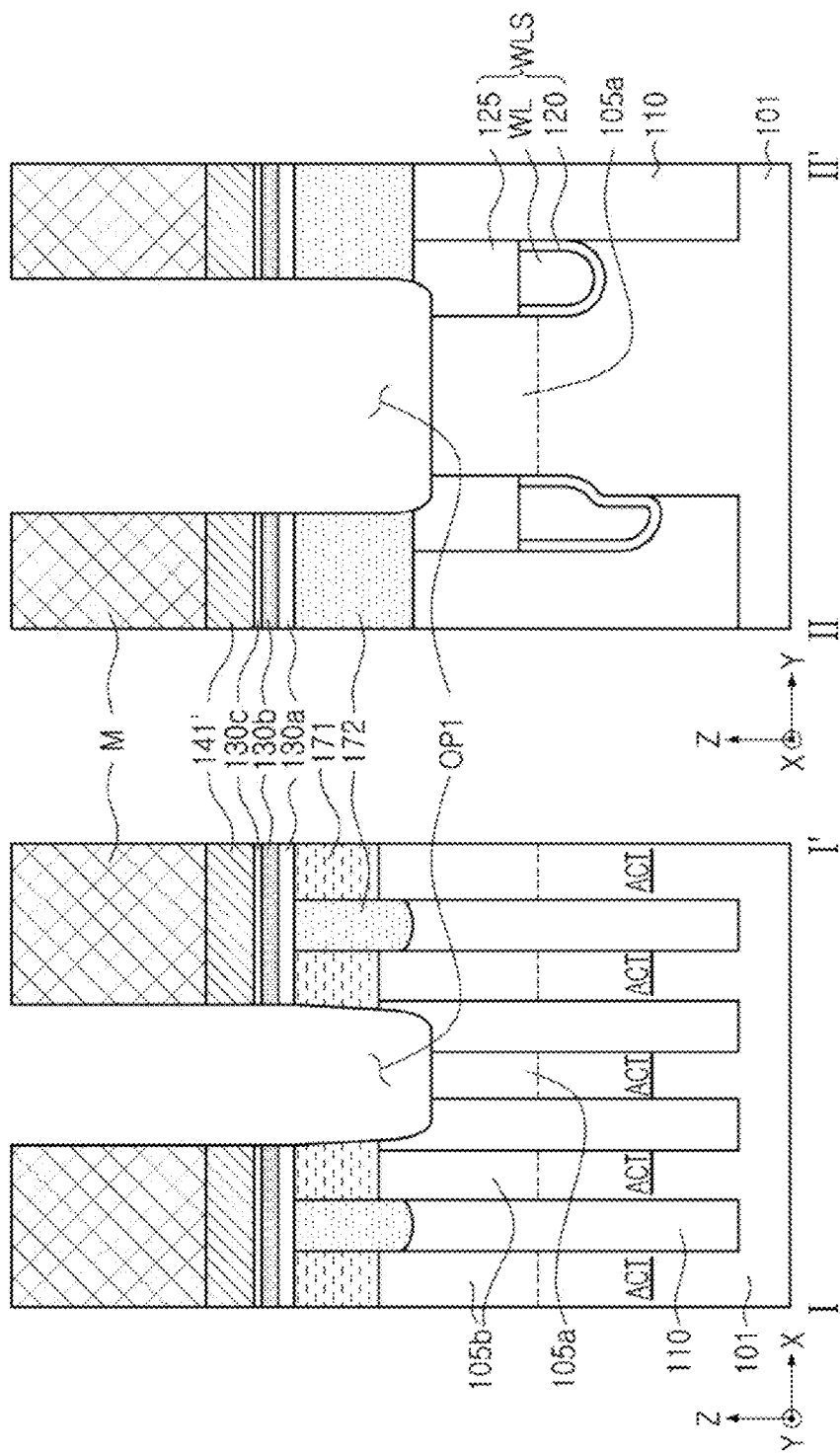
Figure 10C:
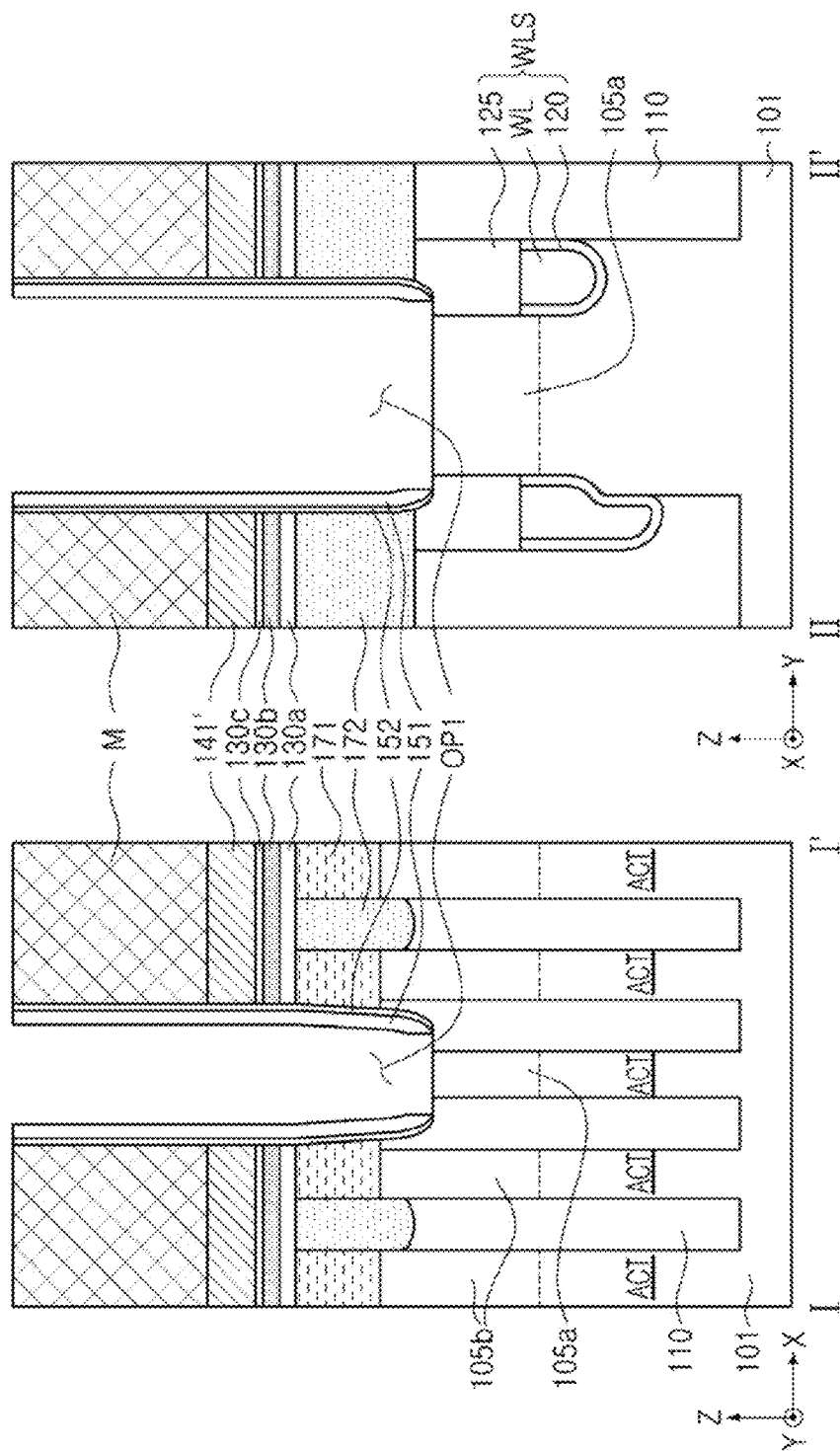
Figure 10D:
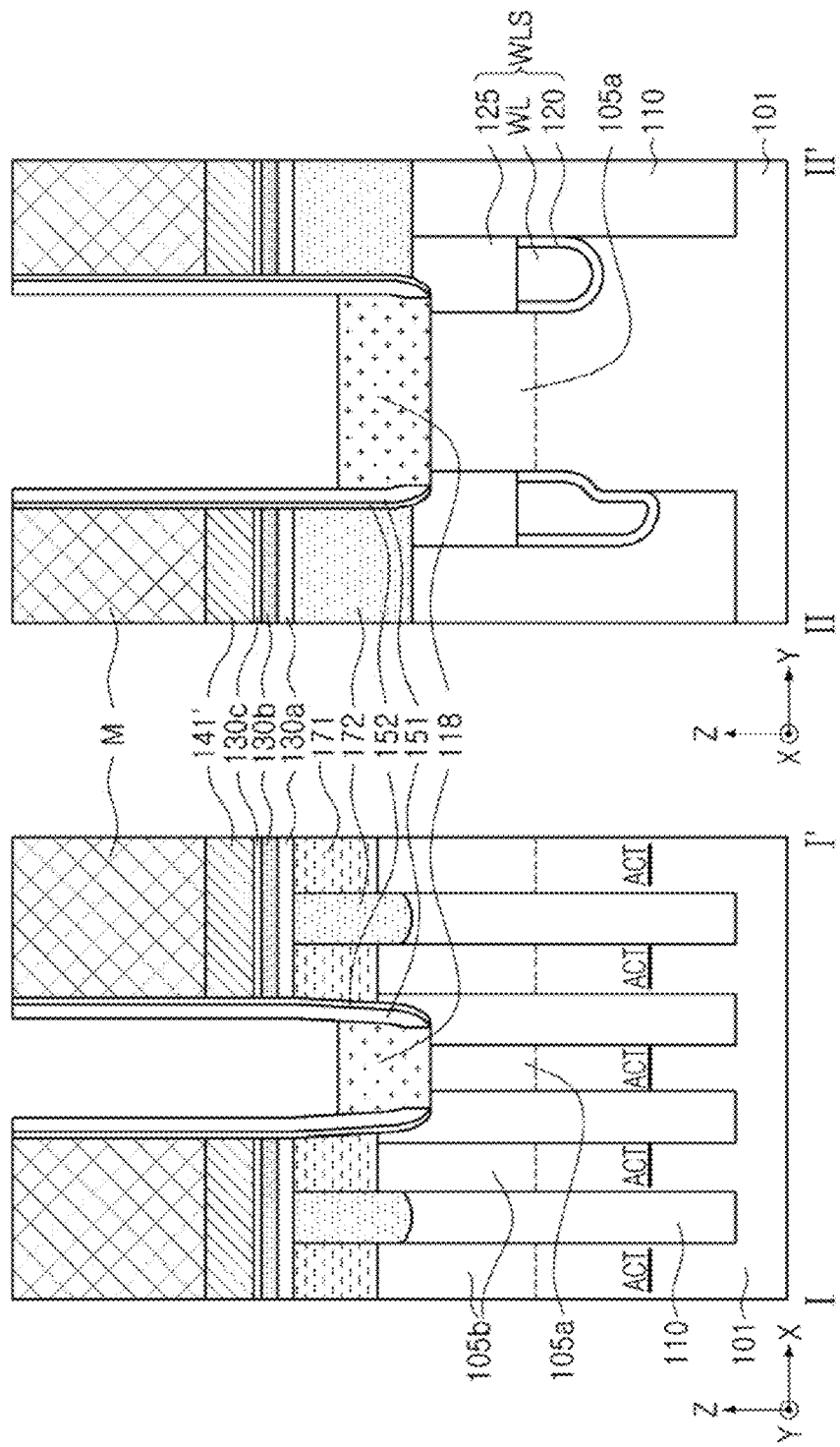
Figure 10E:
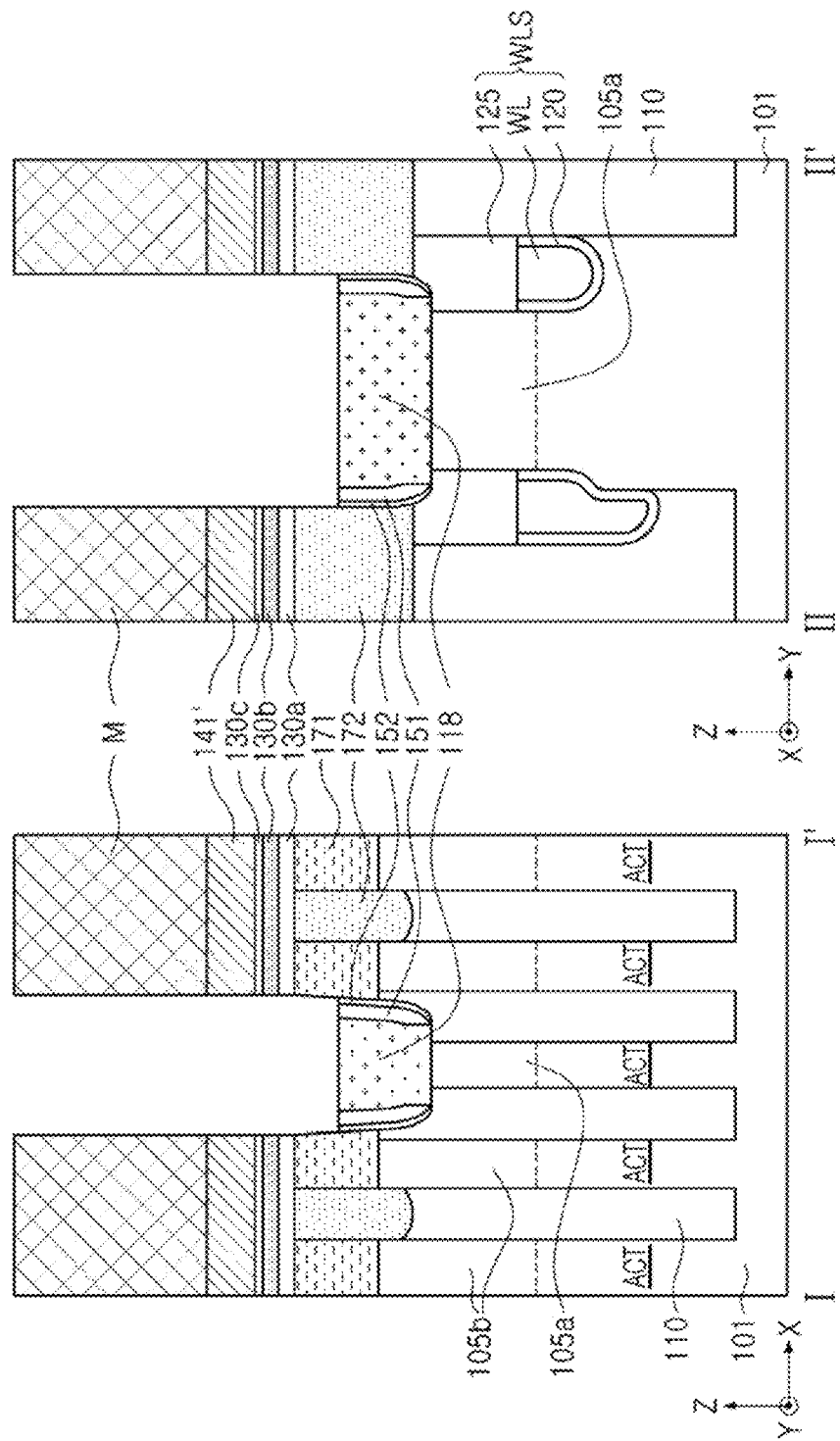

In an example embodiment, the upper surface LS_US of the lower spacer structure LS may have a concave shape, which may be a structure generated by isotropically etching and removing a portion of the lower spacer structure LS, referring to FIG. 10E.

Figure 5:
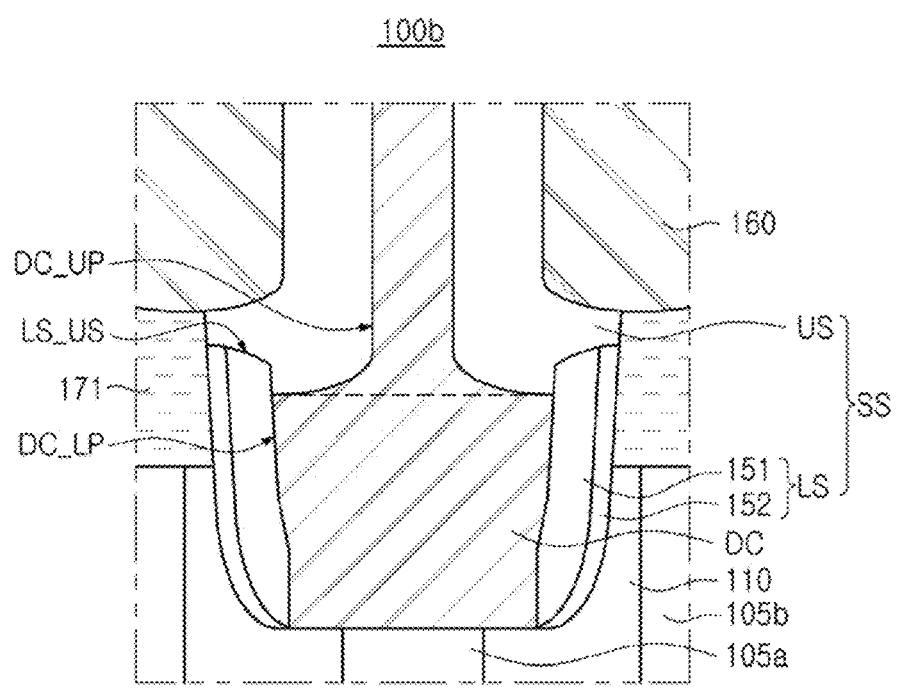
FIG. 5 is a partially enlarged cross-sectional view of a semiconductor device according to some example embodiments.

FIG. 5 is a partially enlarged cross-sectional view of a semiconductor device 100b according to some example embodiments.

Referring to FIG. 5, the upper surface LS_US of the lower spacer structure LS may be positioned on levels that becomes higher in a direction away from the bit line contact pattern DC. Accordingly, the lower spacer structure LS may have an upper end in an area in contact with the plurality of conductive pads 171 and/or the insulating pattern 172, and may have an inclined upper surface.

Figure 10F:
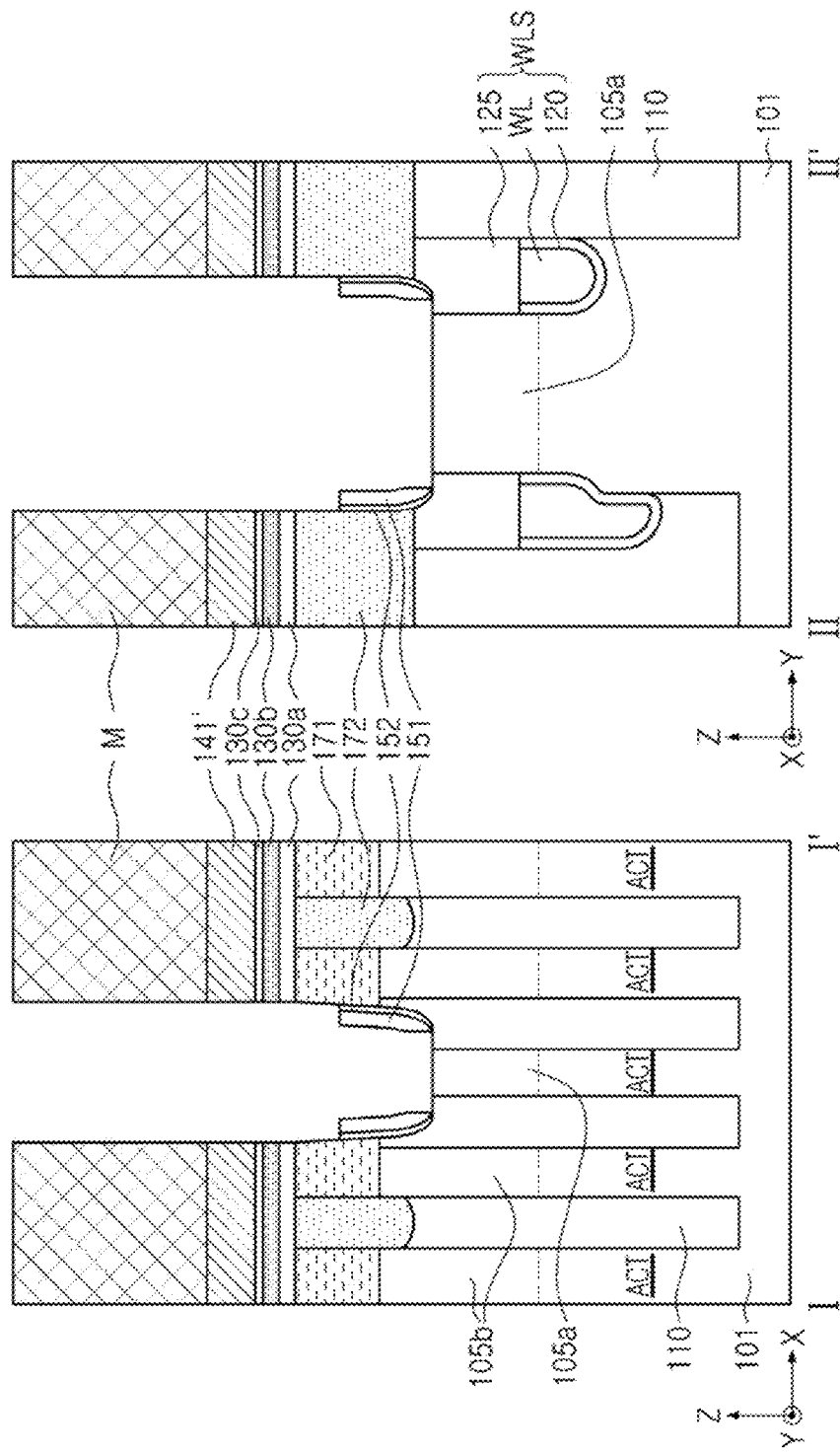
Figure 10G:
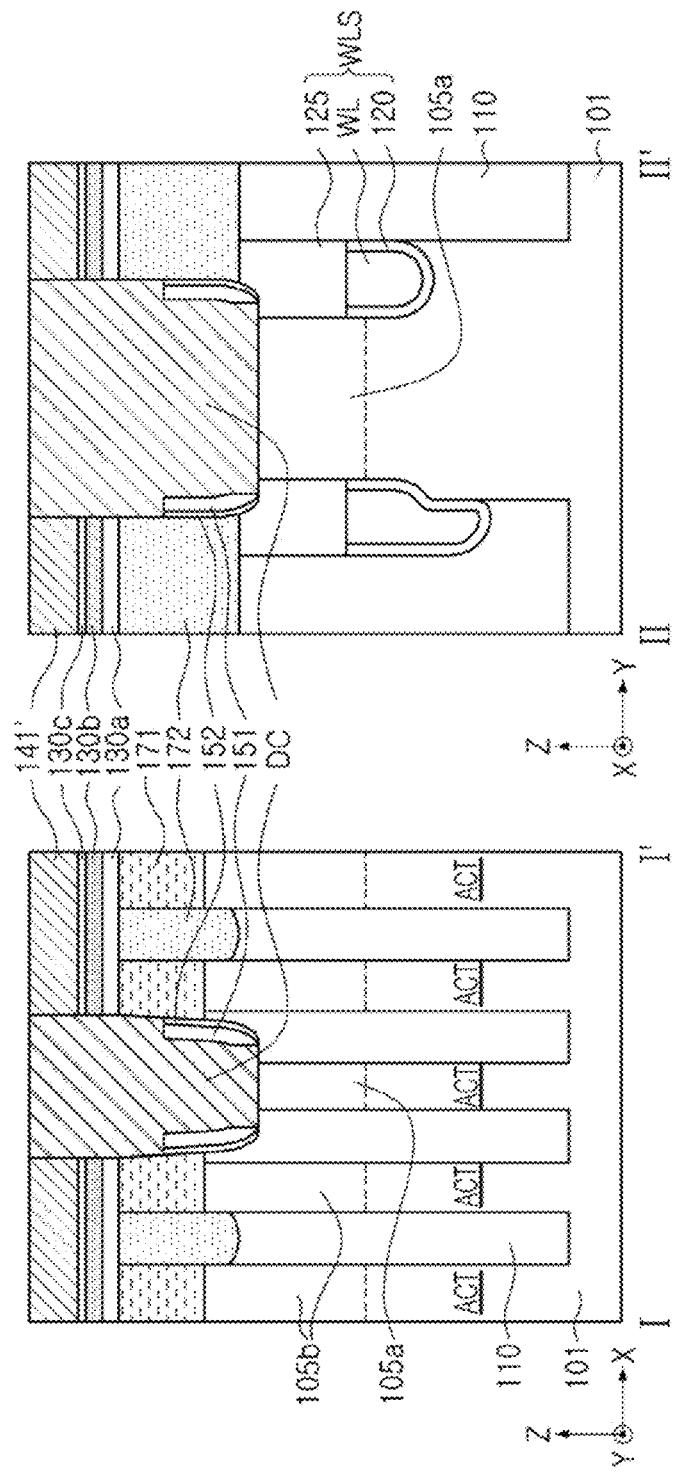
Figure 10H:
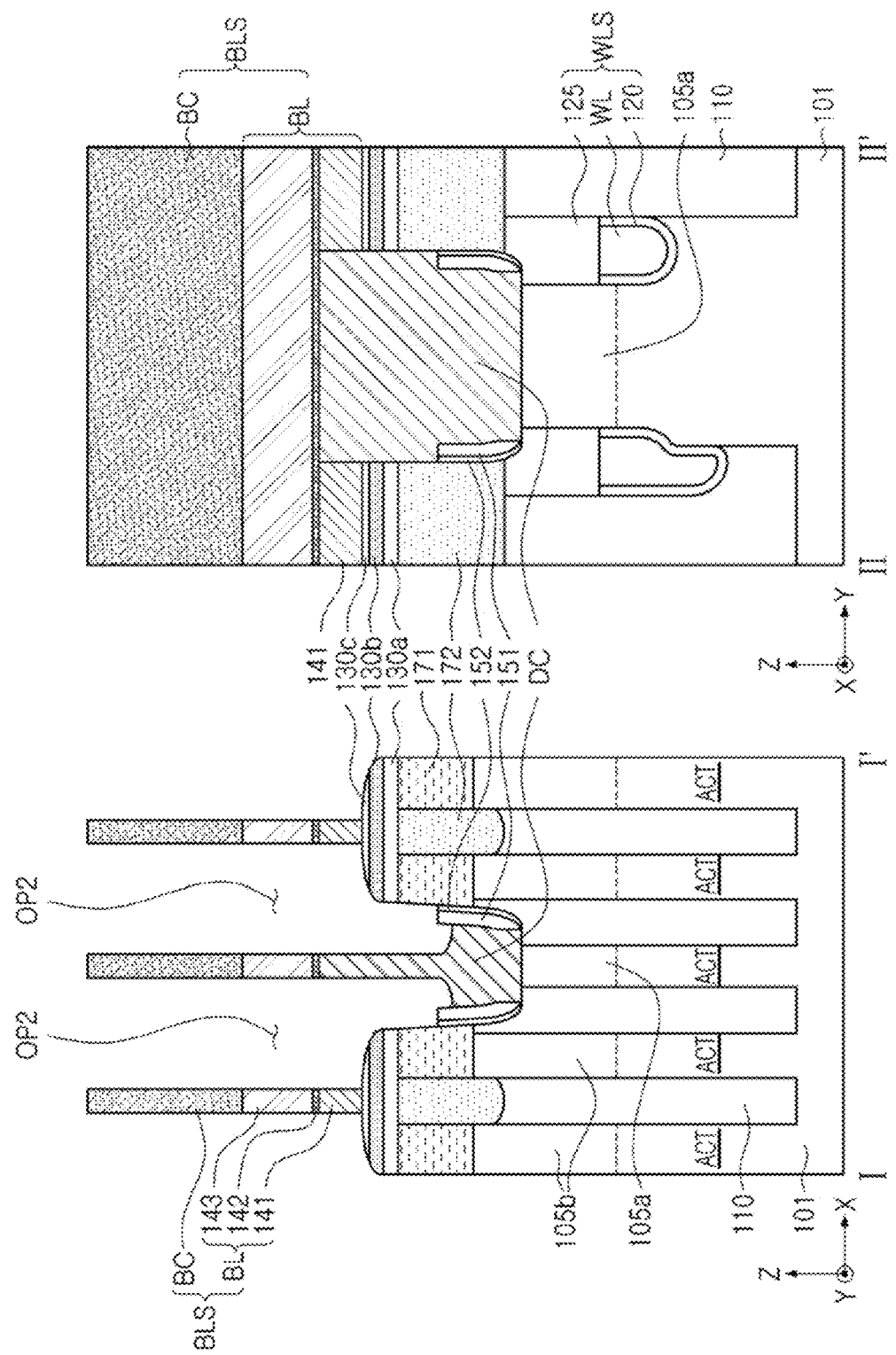

Unlike FIG. 4, the upper surface LS_US of the lower spacer structure LS may have a convex shape, which may be a structure generated by etching and removing an edge portion of the lower spacer structure LS through a subsequent etching process illustrated in FIG. 10H and the like.

Figure 6:
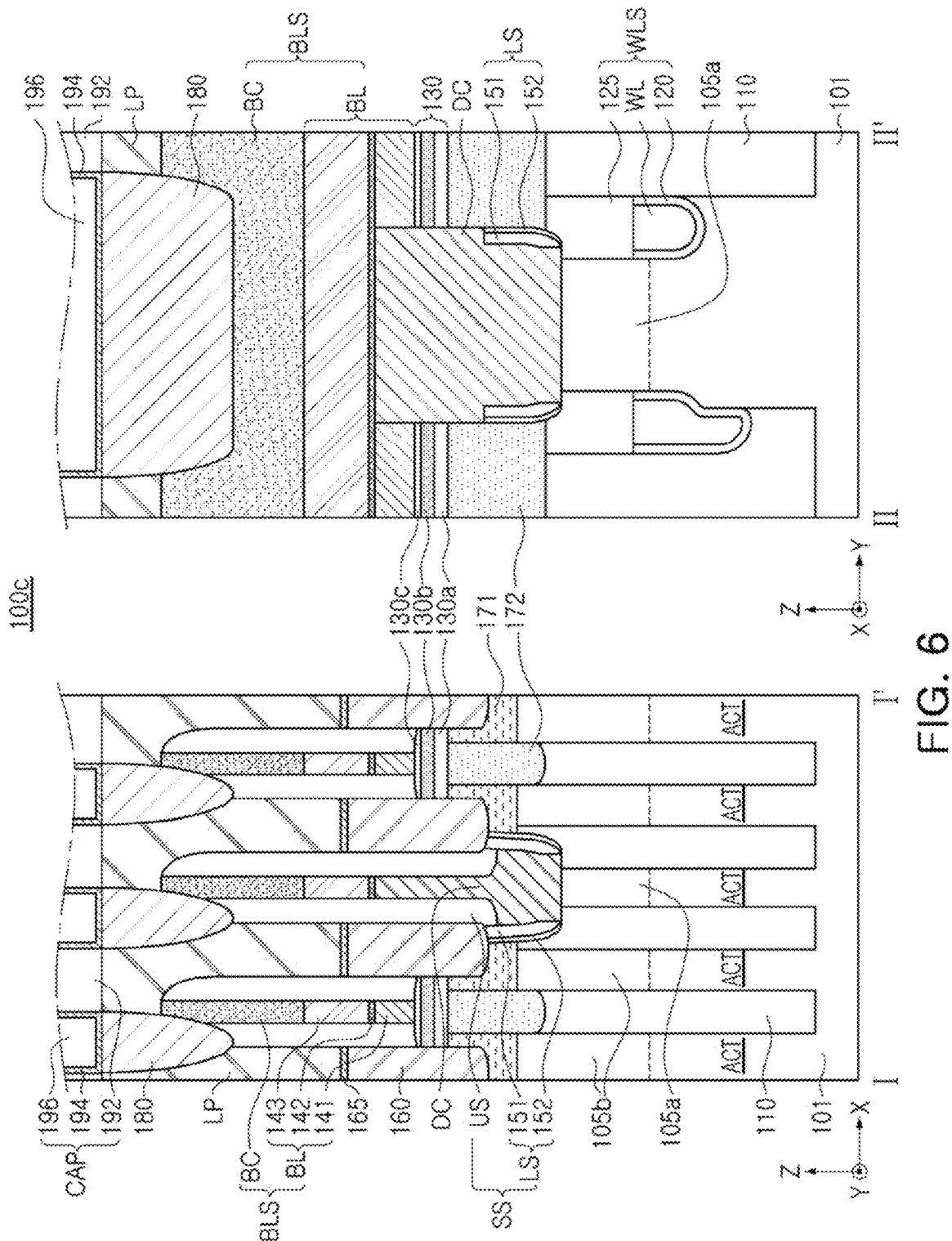
FIG. 6 is a schematic cross-sectional view of a semiconductor device according to some example embodiments.

FIG. 6 is a schematic cross-sectional view of a semiconductor device 100c according to some example embodiments.

Referring to FIG. 6, the storage node contact 160 and the lower spacer structure LS may be in contact with each other, which may be a structure occurring when a hole for forming the storage node contact 160 is recessed relatively deeply, or alternatively, may be a structure occurring when the upper end of the lower spacer structure LS is formed relatively high.

The upper end of the lower spacer structure LS may be positioned on a level the same or substantially the same as that of the lower end of the storage node contact 160. The storage node contact 160 may cover the upper surface of the lower spacer structure LS.

Figure 7:
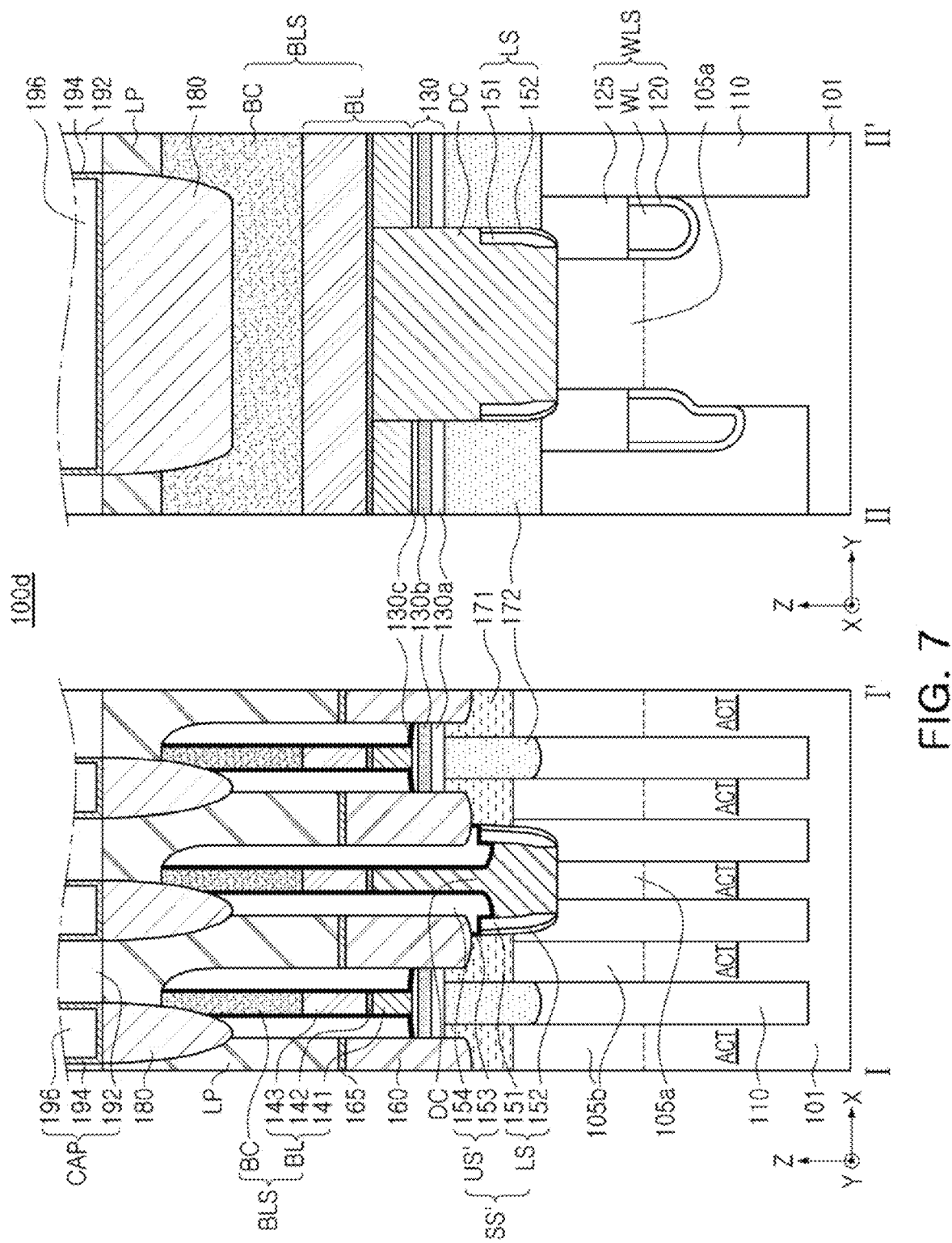
FIG. 7 is a schematic cross-sectional view of a semiconductor device according to some example embodiments.

FIG. 7 is a schematic cross-sectional view of a semiconductor device 100d according to some example embodiments.

Referring to FIG. 7, the upper spacer structure US may include a first upper spacer 153 covering the bit line structure BLS and the lower spacer structure LS, and a second upper spacer 154 covering the first upper spacer 153. The first upper spacer 153 may have a thickness less than a thickness of the second upper spacer 154, and may be conformally disposed on a side wall of the bit line structure BLS. However, in some example embodiments, the thickness of the first upper spacer 153 may be greater than the thickness of the second upper spacer 154. In an example embodiment, the first upper spacer 153 may cover portions of the upper surface and the side surface of the lower spacer structure LS. However, as illustrated in FIG. 6, when the storage node contact 160 covers the upper surface of the lower spacer structure LS, the first upper spacer 153 may cover only a portion of the side surface of the lower spacer structure LS.

In an example embodiment, the first and second upper spacers 153 and 154 may include different insulating materials. For example, the first upper spacer 153 may include silicon oxide, and the second upper spacer 154 may include silicon nitride. However, even when the first and second upper spacers 153 and 154 include the same or substantially the same material, the first and second upper spacers 153 and 154 may be distinguished from each other due to a manufacturing process condition.

Figure 8:
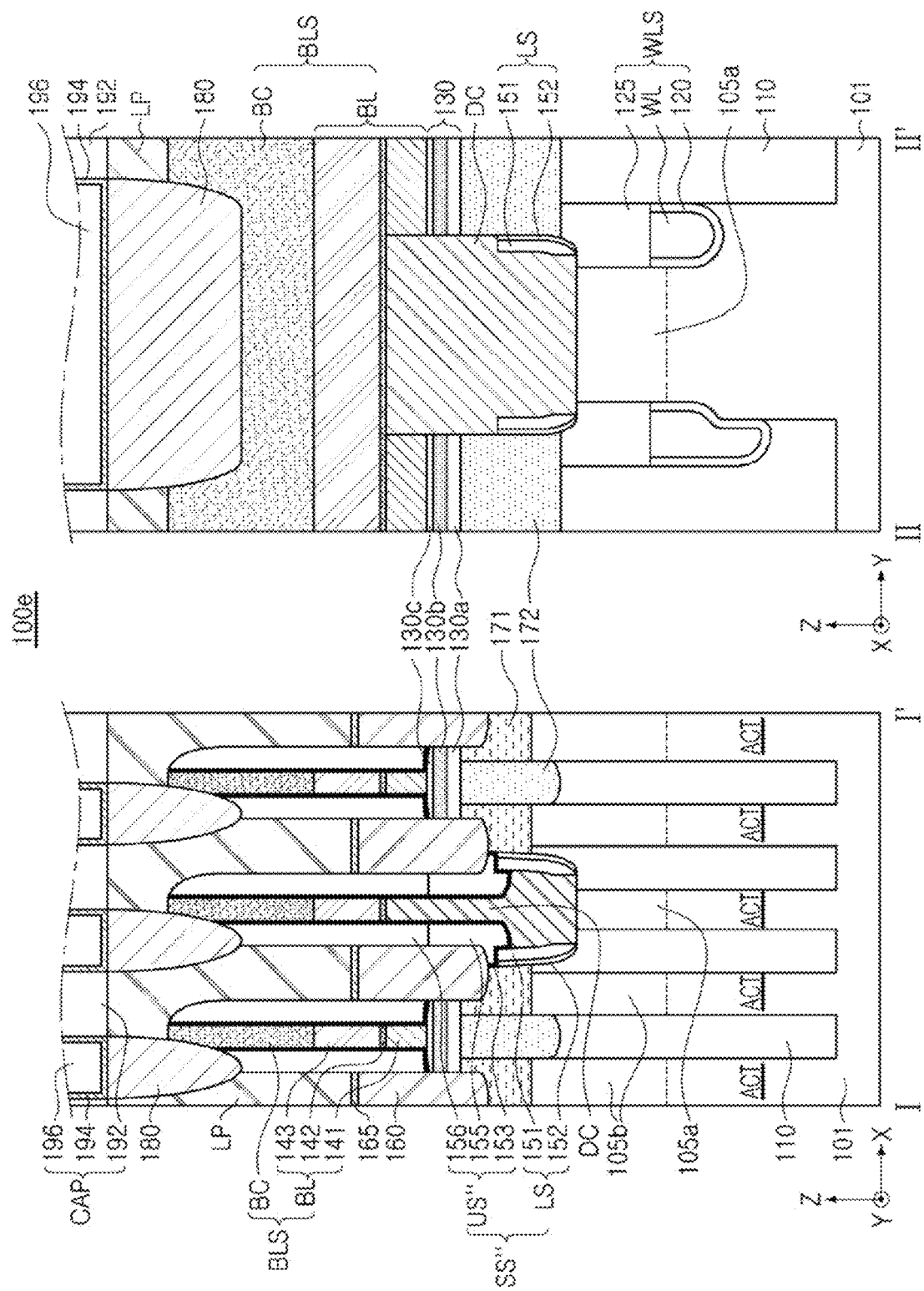
FIG. 8 is a schematic cross-sectional view of a semiconductor device according to some example embodiments.

FIG. 8 is a schematic cross-sectional view of a semiconductor device 100e according to example embodiments.

Referring to FIG. 8, the upper spacer structure US may include the first upper spacer 153 covering the bit line structure BLS and the lower spacer structure LS, a third upper spacer 155 covering a portion of the first upper spacer 153, and a fourth upper spacer 156 on the third upper spacer 155. The first upper spacer 153 may have the same or substantially the same shape as that described with reference to FIG. 7, and thus a description thereof is omitted.

The third upper spacer 155 may partially fill a portion of a space between the first upper spacer 155 and the storage node contact 160. The third upper spacer 155 may have an upper surface the same or substantially the same as an upper surface of the barrier pattern 130.

The fourth upper spacer 156 may fill a space between the storage node contact 160 and the bit line structure BLS on the third upper spacer 155. The third and fourth upper spacers 155 and 156 may include an insulating material, for example, silicon oxide, silicon nitride, silicon oxynitride, a low-k material, or a combination thereof, but example embodiments are not limited thereto. The third and fourth upper spacers 155 and 156 may include different insulating materials, but are not limited thereto and may include the same material. However, in some example embodiments, the third and fourth upper spacers 155 and 156 may be distinguished from each other according to a manufacturing process condition.

Figure 9:
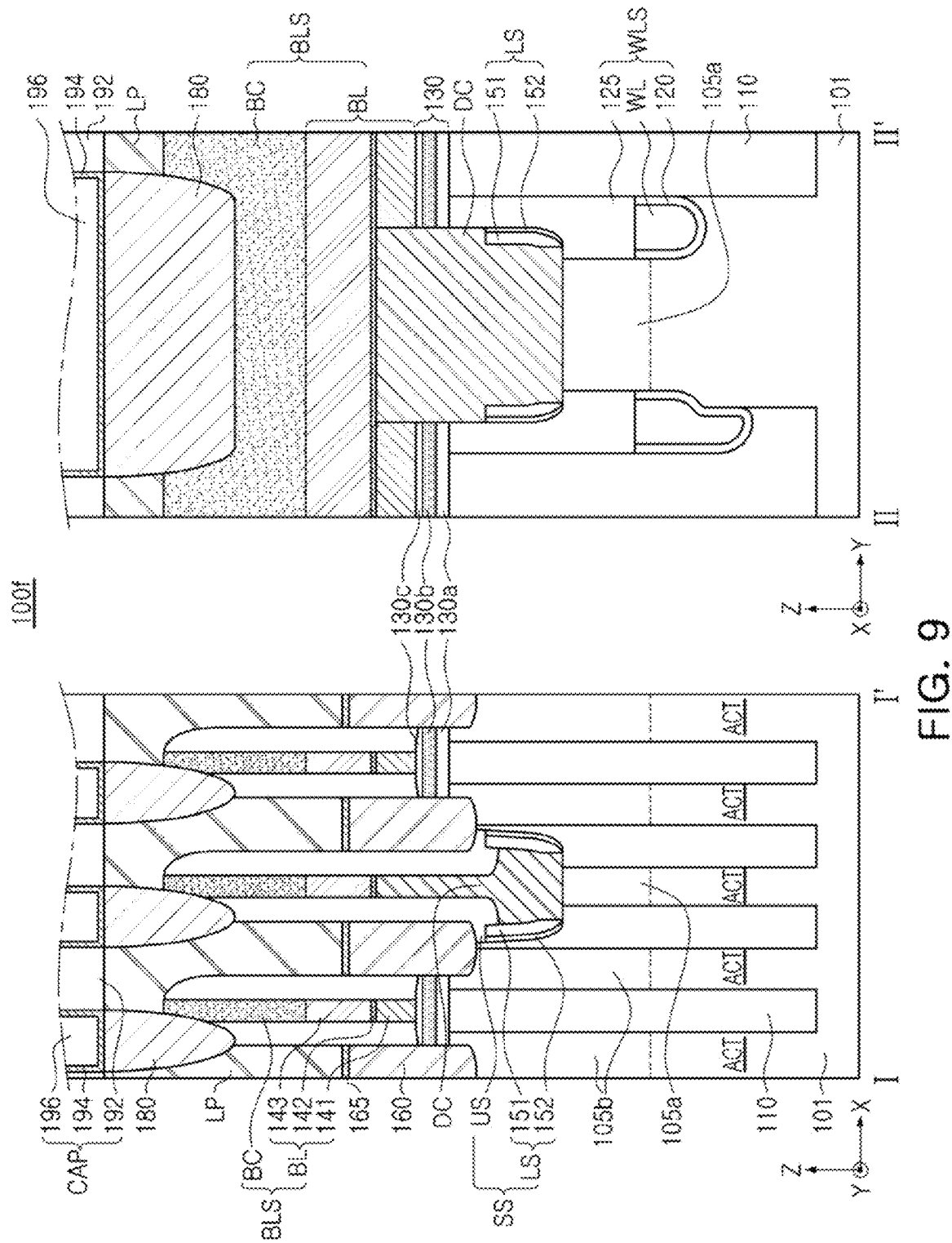
FIG. 9 is a schematic cross-sectional view of a semiconductor device according to some example embodiments.

FIG. 9 is a schematic cross-sectional view of a semiconductor device 100f according to some example embodiments.

Referring to FIG. 9, the semiconductor device 100f may not include the plurality of conductive pads 171 and the insulating pattern 172.

The barrier pattern 130 may be in contact with the substrate 101 between the bit line structure BLS and the substrate 101. The storage node contact 160 may pass through the barrier pattern 130 to be in direct contact with the second impurity region 105b.

The bit line contact pattern DC may be spaced apart from the second impurity region 105b and/or the storage node contact 160 by the spacer structures SS. The lower spacer structure LS may be positioned on a level lower than that of the lower surface of the barrier pattern 130 or that of a lower surface of the storage node contact 160.

As described with reference to FIG. 2, as the upper end of the lower spacer structure LS is relatively lowered, a difficulty level of a contact hole forming process for manufacturing the storage node contact 160 may be improved.

FIGS. 10A to 10K are schematic cross-sectional views illustrating a method of manufacturing a semiconductor device according to some example embodiments.

Referring to FIG. 10A, the device isolation layers 110 defining the active region ACT may be formed in the substrate 101, and the word line structure WLS may be formed in the substrate 101. On the substrate 101, the plurality of conductive pads 171 and the insulating pattern 172 may be formed, and barrier patterns 130a, 130b, and 130c may be formed.

First, according to a shallow trench isolation (STI) process, the substrate 101 may be anisotropically etched to form trenches, and insulating materials may be deposited in the trenches, and then a planarization process may be performed to form the device isolation layers 110. Impurities may be implanted into the substrate 101 before the device isolation layers 110 are formed to form impurity regions 105a and 105b. However, in some example embodiments, the impurity regions 105a and 105b may be formed after the device isolation layers 110 are formed or in another processing operation.

The substrate 101 may be anisotropically etched to form gate trenches in which the word lines WL are disposed. The gate trenches may extend in the X-direction, and intersect the active region ACT and the device isolation layers 110. The gate dielectric layer 120, the word line WL, and the buried insulating layer 125 may be sequentially formed in the gate trenches. The gate dielectric layer 120 may be formed to have a uniform or substantially uniform thickness on at least portions of inner side walls and bottom surfaces of the gate trenches. The gate dielectric layer 120 may be formed by an oxidation process of the active region ACT or a deposition process of a dielectric material. The word lines WL may be formed by depositing a conductive material in the gate trenches, and recessing the conductive material to have a desired (or alternatively, predetermined) depth from an upper portion thereof. The buried insulating layer 125 may be formed by depositing an insulating material to fill a remaining portion of the gate trench, and then performing a planarization process. Accordingly, the word line structures WLS may be formed.

A conductive material layer may be formed on the substrate 101, and a portion of the conductive material layer may be etched to form a trench passing through the conductive material layer, and the plurality of conductive pads 171. The insulating pattern 172 may be formed by filling the trench with an insulating material and performing a planarization process.

The first to third barrier patterns 130a, 130b, and 130c may be sequentially deposited on the plurality of conductive pads 171 and the insulating pattern 172. The first to third barrier patterns 130a, 130b, and 130c may include different insulating materials. For example, the first barrier pattern 130a, the second barrier pattern 130b, and the third barrier pattern 130c may include silicon oxide, silicon nitride, and silicon oxynitride, respectively, but example embodiments are not limited thereto. That is, the number of layers, the thickness, and the material of each of the barrier patterns 130a, 130b, and 130c may be changed in various ways.

Referring to FIG. 10B, on the barrier patterns 130a, 130b, and 130c, a first preliminary conductive layer 14F may be formed, and a first opening OP1 may be formed.

The first preliminary conductive layer 14F may be deposited on the barrier patterns 130a, 130b, and 130c. The first preliminary conductive layer 14F may include, for example, polycrystalline silicon.

Subsequently, a mask M may be formed on the first preliminary conductive pattern 14F, and an etching process may be performed using the mask M to form a first opening OP1 passing through the barrier patterns 130a, 130b, and 130c, the plurality of conductive pads 171, and the insulating pattern 172. In an example embodiment, the mask M may include silicon oxide. A portion of the substrate 101 may be exposed by the first opening OP1.

Referring to FIG. 10C, the first and second lower spacers 151 and 152 covering an inner side wall of the first opening OP1 may be formed.

The second lower spacer 152 conformally covering the inner side wall and a bottom surface of the first opening OP1 may be deposited, and the first lower spacer 151 may be deposited on the second lower spacer 152. Thereafter, an anisotropic etching process may be performed to remove the first and second lower spacers 151 and 152 on the bottom surface of the first opening OP1. Accordingly, the first and second spacers 151 and 152 covering the inner side wall of the first opening OP1 may be formed.

Referring to FIG. 10D, a mold layer 118 may be formed to have a partial depth in the first opening OP1.

The mold layer 118 may cover an exposed upper surface of the substrate 101. The mold layer 118 may be formed to have an upper surface lower than the upper surfaces of the plurality of conductive pads 171. In an example embodiment, the mold layer 118 may include carbon (C), but the material of the mold layer 118 is not limited thereto.

Referring to FIGS. 10E and 10F, portions of the first and second lower spacers 151 and 152 may be removed, and the mold layer 118 may be removed.

Portions of the first and second lower spacers 151 and 152 may be removed by performing an isotropic etching process. In an example embodiment, the isotropic etching process may be performed using a fluorine (F) gas. Upper surfaces of the first and second lower spacers 151 and 152 may be positioned on a level the same or substantially the same as that of an upper surface of the mold layer 118. The second lower spacer 152 may have an upper end on a level lower than that of the upper surfaces of the plurality of conductive pads 171 and/or the insulating pattern 172, and may cover portions of the side surfaces of the plurality of conductive pads 171.

The mold layer 118 may be selectively removed with respect to the first and second lower spacers 151 and 152. Accordingly, the first and second lower spacers 151 and 152 may not be removed, and may maintain upper ends formed through the isotropic etching process.

Referring to FIG. 10G, the bit line contact pattern DC may be formed.

After a conductive material covering the first and second lower spacers 151 and 152 and the first opening OP1 are formed, a portion of the conductive material may be removed through an etch-back process to form the bit line contact pattern DC, and remove the mask M. In an example embodiment, the conductive material may include polycrystalline silicon. The first preliminary conductive layer 14F and the bit line contact pattern DC may have the same or substantially the same upper surface.

Referring to FIG. 10H, the bit line structure BLS may be formed.

First, second and third preliminary conductive layers and a preliminary bit line capping layer may be sequentially formed on the bit line contact pattern DC and the first preliminary conductive layer 141', and a second opening OP2 passing therethrough may be formed, thereby forming the first conductive pattern 141, the second conductive pattern 142, the third conductive pattern 143, and the bit line capping pattern BC that are sequentially stacked. Accordingly, the bit line BL including the first to third conductive patterns 141, 142, and 143, and the bit line structure BLS including the bit line capping pattern BC may be formed.

As the substrate 101 is not exposed through the bit line contact pattern DC in an etching process of forming the second opening OP2, the bit line contact pattern DC may include a lower portion having a first width in the x direction, and an upper portion having a second width substantially equal to that of the second conductive pattern 142 on the lower portion. The first width may be greater than the second width.

As the bit line contact pattern DC is selectively removed with respect to the first and second lower spacers 151 and 152 in the etching process of forming the second opening OP2, a level of a lower surface of the second opening OP2 to which the first and second lower spacers 151 and 152 are exposed may be higher than a level of a lower surface of the second opening OP2 to which the bit line contact pattern DC is exposed.

Figure 10I:
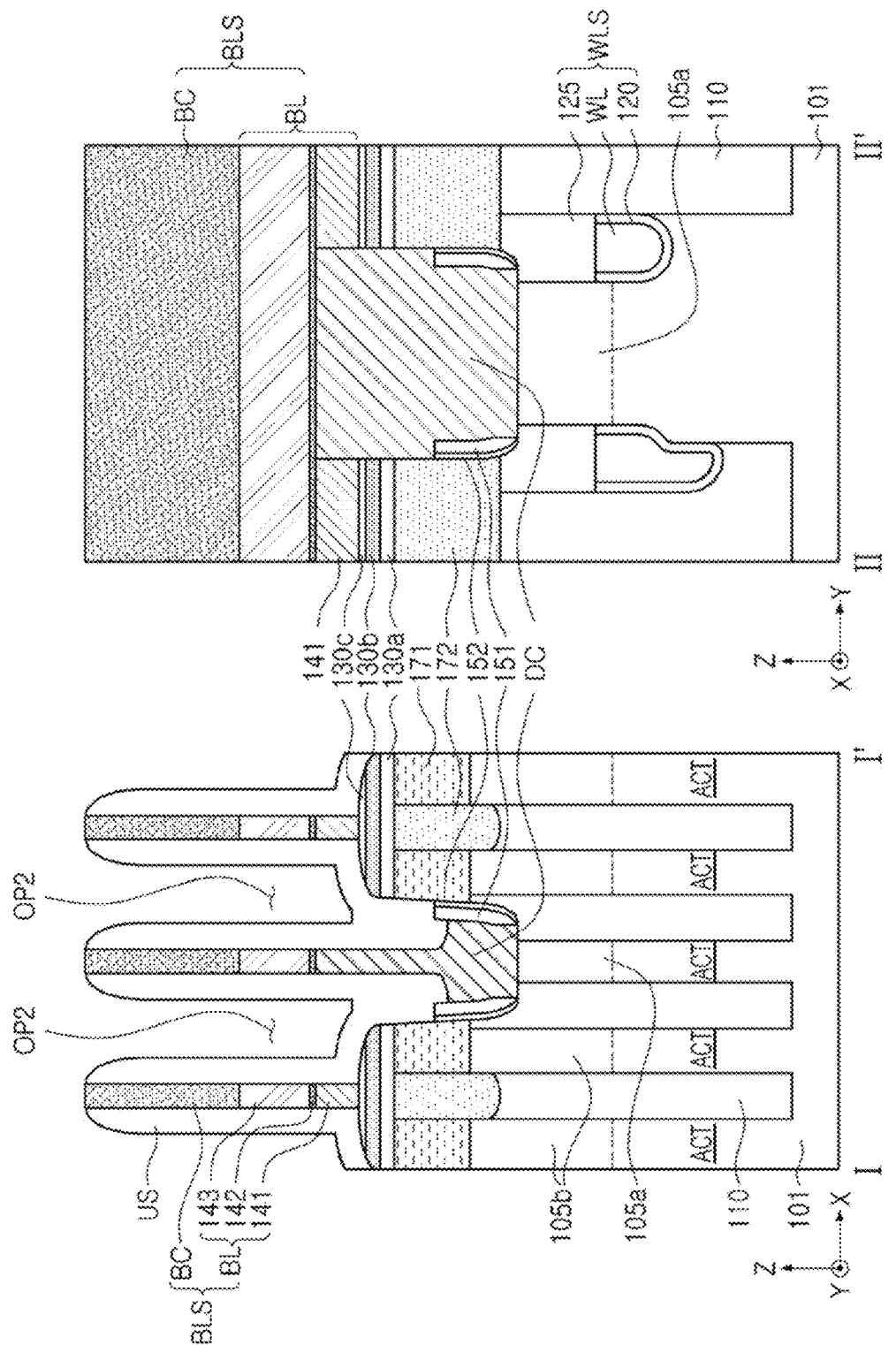

Referring to FIG. 10I, the upper spacer structure US may be formed in the second opening OP2.

The upper spacer structure US may cover an inner side wall and a bottom surface of the second opening OP2. Accordingly, the upper spacer structure US may cover the side wall of the bit line structure BLS, and may cover the bit line contact pattern DC and the lower spacers 151 and 152.

Figure 10J:
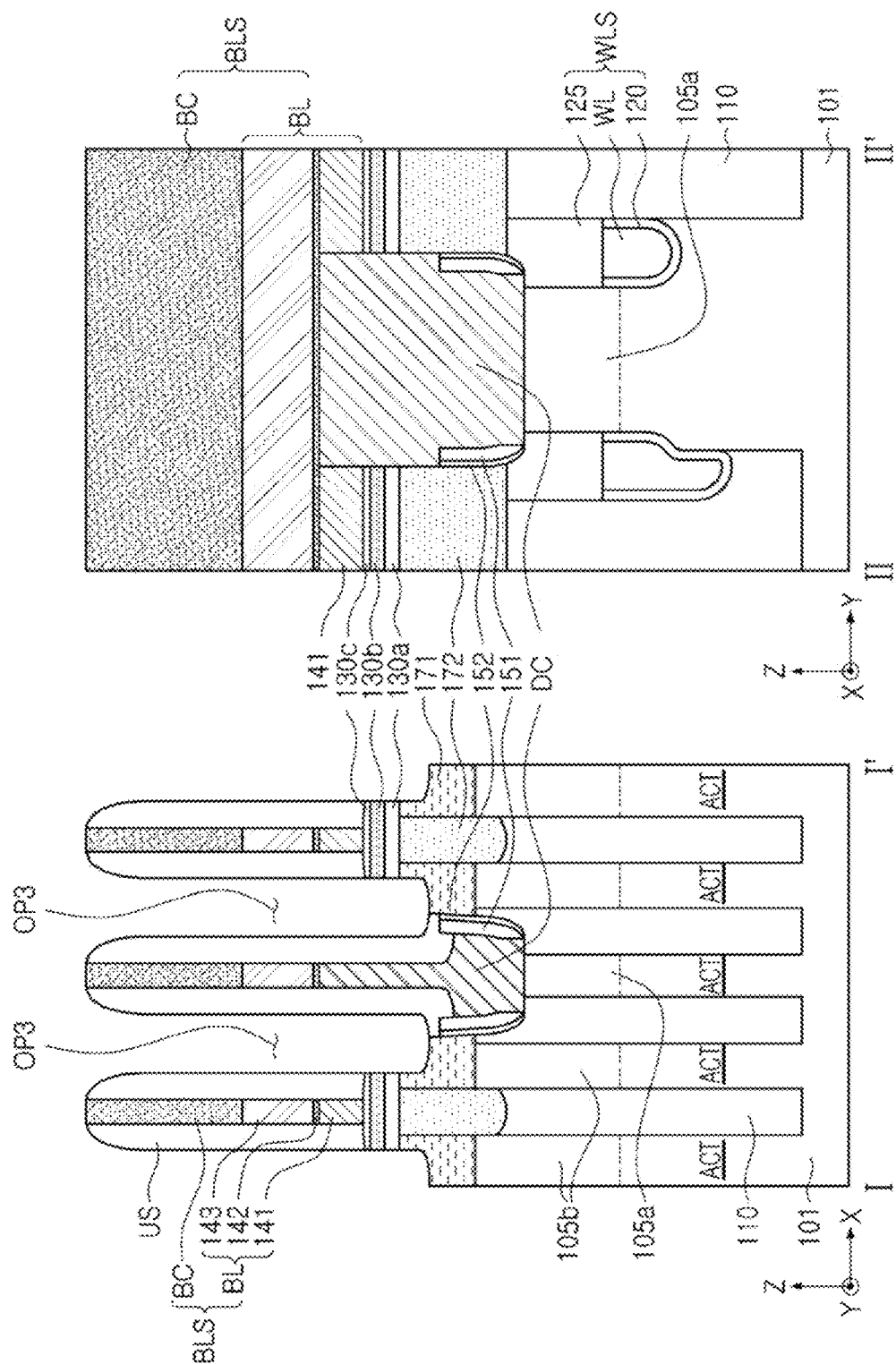

Referring to FIG. 10J, a third opening OP3 may be formed.

First, an insulating fence may be formed by forming sacrificial patterns between the bit line structures BLS, and etching portions of the sacrificial patterns to fill an insulating material different from those of the sacrificial patterns, for example, silicon nitride. The insulating fence may be disposed to overlap the word line structure WLS in a z direction. The sacrificial patterns and the insulating fence may be alternately disposed along the y direction.

Subsequently, an etching process may be performed on the sacrificial patterns and a portion of the upper spacer structure US to form the third opening OP3. The third opening OP3 may pass through the barrier patterns 130a, 130b, and 130c. In addition, the third opening OP3 may remove portions of the plurality of conductive pads 171 to expose the plurality of conductive pads 171.

In the etching process, due to a narrow width between the bit line structure BLS and/or the bit line contact pattern DC and the lower spacers 151 and 152, or a different etch ratio between the lower spacers 151 and 152 and the plurality of conductive pads 171, a difficulty level of a process for forming the third opening OP3 may be increased. However, by lowering the upper ends of the lower spacers 151 and 152 to a level lower than those of the upper surfaces of the plurality of conductive pads 171 through FIGS. 10D to 10F, the width between the bit line structure BLS and/or the bit line contact pattern DC and the plurality of conductive pads 171 may be relatively widened, and the lower spacers 151 and 152 may not affect the etching process. Accordingly, even when the width between the plurality of conductive pads 171 and the bit line contact pattern DC is relatively narrow, the third opening OP3 may be easily formed.

In addition, the third opening OP3 may be formed to have a relatively deeper depth to sufficiently expose the plurality of conductive pads 171. That is, the lower spacers 151 and 152 may increase a contact area between the plurality of conductive pads 171 and the storage node contact 160 (see FIG. 10K) to be formed through a subsequent process while electrically isolating the plurality of conductive pads 171 and the bit line contact pattern DC from each other, thereby providing a semiconductor device having improved electrical characteristics.

Figure 10K:
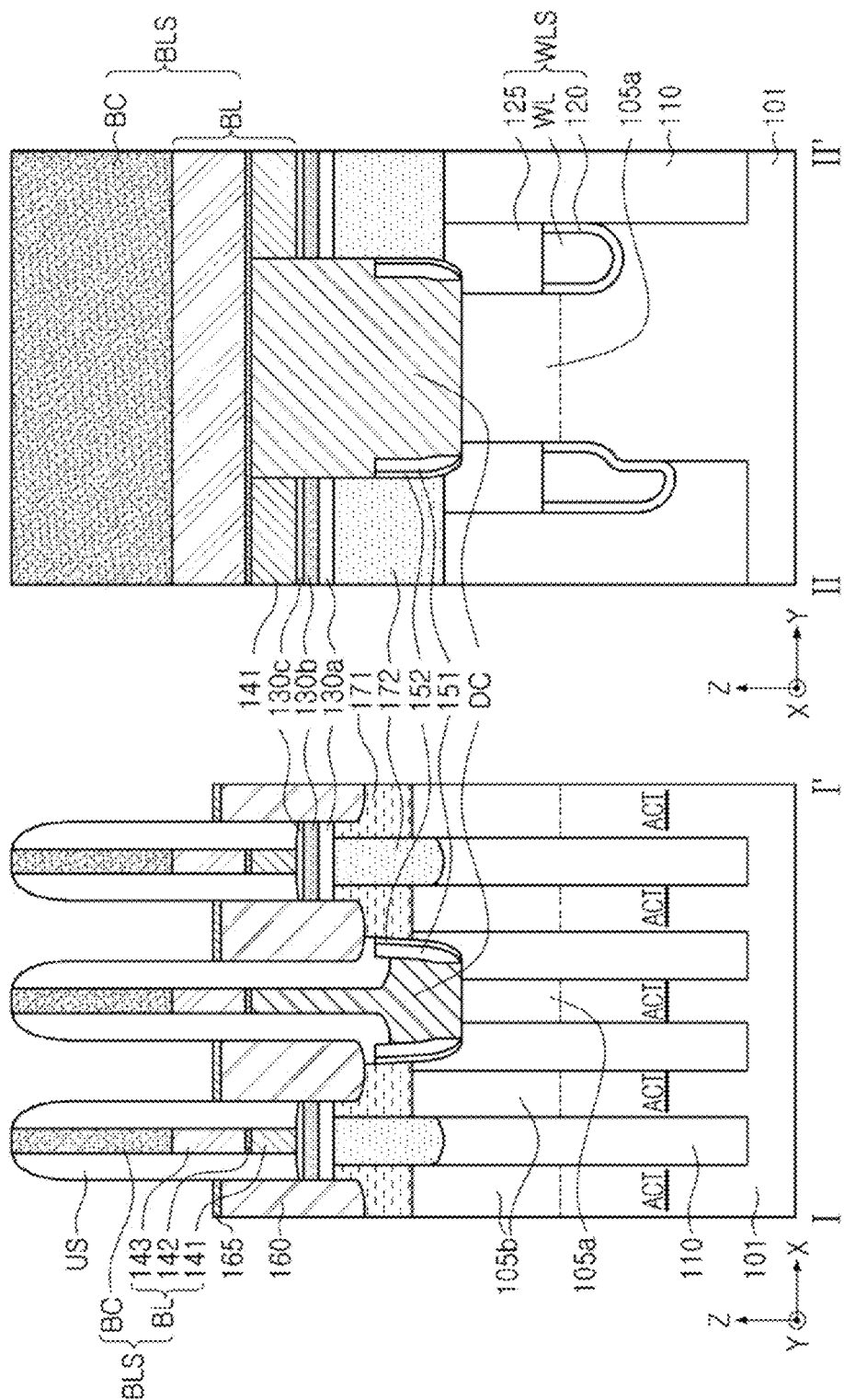

Referring to FIG. 10K, the storage node contact 160 and the metal-semiconductor layer 165 may be formed.

The storage node contact 160 may be formed by filling the third opening OP3 with a conductive material and performing an etching process. The conductive material may include, for example, at least one of a doped semiconductor material, a metal, and a metal nitride, but example embodiments are not limited thereto. In some example embodiments, the conductive material may include polycrystalline silicon.

Subsequently, the metal-semiconductor layer 165 may be formed on the storage node contact 160. The metal-semiconductor layer 165 may be formed by reacting the upper surface of the storage node contact 160 with a metal material. The reaction may include, for example, a silicide process.

Subsequently, referring to FIG. 2, the landing pad LP may be formed, the capping insulating layer 180 may be formed, and the capacitor structure CAP may be formed.

First, the landing pad LP may be formed on the metal-semiconductor layer 165. The landing pad LP may extend between the bit line structures BLS, and the landing pads LP respectively connected to the storage node contacts 160 may be isolated from each other.

Subsequently, the capping insulating layer 180 extending between the landing pads LP and being in contact with the upper spacer structure US may be formed.

Subsequently, after a portion of the capping insulating layer 180 is removed by performing a planarization process and/or an etch-back process, the capacitor structure CAP may be formed on the landing pad LP. Accordingly, the semiconductor device 100 of FIGS. 1 to 3 may be manufactured.

According to some example embodiments, a spacer structure may be optimized in terms of a structure, thereby providing a semiconductor device having improved electrical characteristics.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

While some example embodiments have been shown and described above, it will be apparent that modifications and variations could be made without departing from the inventive concepts.

What is claimed is:

1. A semiconductor device comprising:
   a substrate including an active region;
   a word line structure extending in a first horizontal direction;
   a bit line structure on the substrate, the bit line structure extending in a second horizontal direction, the second horizontal direction intersecting the first horizontal direction;
   a bit line contact pattern configured to electrically connect a first impurity region of the active region with the bit line structure, the bit line contact pattern including a lower portion and an upper portion, the upper portion having a width narrower than a width of the lower portion in the first horizontal direction;
   a storage node contact on a side wall of the bit line structure, the storage node contact electrically connected to a second impurity region of the active region;
   a spacer structure on a side wall of the bit line structure, the spacer structure on a side wall of the bit line contact pattern, the spacer structure including a lower spacer structure surrounding a side surface of the lower portion, the spacer structure including an upper spacer structure disposed on a side surface of the upper portion and extending under and contacting a bottom surface of the storage node contact, the side wall of the bit line structure on the lower spacer structure, and an upper end of the lower spacer structure on a level same as or lower than a level of a lower end of the storage node contact; and
   a capacitor structure electrically connected to the storage node contact.

2. The semiconductor device of claim 1, wherein the level of the upper end of the lower spacer structure is higher than the lower portion of the bit line contact pattern.

3. The semiconductor device of claim 1, wherein the lower spacer structure includes a first lower spacer surrounding the side surface of the lower portion and a second lower spacer surrounding an outer side surface of the first lower spacer.

4. The semiconductor device of claim 1, wherein
   the lower spacer structure is spaced apart from the storage node contact, and
   the upper spacer structure extends to a space between the lower spacer structure and the storage node contact.

5. The semiconductor device of claim 1, further comprising:
   a landing pad on the storage node contact, the landing pad configured to electrically connect the storage node contact with the capacitor structure,
   wherein the upper spacer structure extends from a space between the bit line structure and the storage node contact to a space between the bit line structure and the landing pad.

6. The semiconductor device of claim 1, further comprising:
   a plurality of conductive pads on the substrate;
   an insulating pattern configured to space the plurality of conductive pads apart from each other; and
   a barrier pattern on the plurality of conductive pads and the insulating pattern,
   wherein the storage node contact is configured to pass through the barrier pattern to contact the plurality of conductive pads.

7. The semiconductor device of claim 6, wherein the level of the upper end of the lower spacer structure is lower than a level of upper surfaces of the plurality of conductive pads.

8. The semiconductor device of claim 6, wherein the upper spacer structure is in contact with the plurality of conductive pads.

9. The semiconductor device of claim 1, wherein a first portion of an upper surface of the lower spacer structure is at a higher level than a second portion of the upper surface of the lower spacer structure, and the first portion is further away from the bit line contact pattern than the second portion.

10. The semiconductor device of claim 9, wherein the upper surface of the lower spacer structure defines a concave shape.

11. The semiconductor device of claim 9, wherein the upper surface of the lower spacer structure defines a convex shape.

12. The semiconductor device of claim 1, wherein the upper spacer structure includes a first upper spacer covering the bit line structure and the lower spacer structure, a second upper spacer covering a portion of the first upper spacer, and a third upper spacer on the second upper spacer.

13. The semiconductor device of claim 12, further comprising:
a barrier pattern between the bit line structure and the substrate,
wherein an upper surface of the second upper spacer is on a same level as an upper surface of the barrier pattern.

14. A semiconductor device comprising:
a substrate including an active region;
a word line structure extending in a first horizontal direction in the substrate;
a plurality of conductive pads on the substrate;
an insulating pattern configured to space the plurality of conductive pads apart from each other;
a bit line structure on the plurality of conductive pads and the insulating pattern, the bit line structure extending in a second horizontal direction, the second horizontal direction intersecting the first horizontal direction;
a bit line contact pattern configured to electrically connect a first impurity region of the active region with the bit line structure;
a storage node contact on a side wall of the bit line structure, the storage node contact in contact with the plurality of conductive pads and electrically connected to a second impurity region of the active region;
a spacer structure on a side wall of the bit line structure and on a side wall of the bit line contact pattern, the spacer structure including a lower spacer structure surrounding a portion of a side surface of the bit line contact pattern, the spacer structure including an upper spacer structure between the storage node contact and the bit line structure, and an upper end of the lower spacer structure on a level lower than a level of upper surfaces of the plurality of conductive pads wherein the upper spacer structure extends under and contacts a bottom surface of the storage node contact; and
a capacitor structure electrically connected to the storage node contact.

15. The semiconductor device of claim 14, wherein the lower spacer structure is configured to cover portions of side surfaces of the plurality of conductive pads.

16. The semiconductor device of claim 14, wherein the upper spacer structure is configured to space the lower spacer structure and the storage node contact apart from each other, and space the bit line structure and the storage node contact apart from each other.

17. The semiconductor device of claim 14, wherein
in the first horizontal direction, the bit line contact pattern includes a lower portion having a first width and an upper portion having a second width, the second width narrower than the first width, and
the level of the upper end of the lower spacer structure is higher than the lower portion.

18. The semiconductor device of claim 14, wherein the upper end of the lower spacer structure is higher than a level of lower surfaces of the plurality of conductive pads.

19. A semiconductor device comprising:
a plurality of conductive pads on a substrate;
an insulating pattern configured to pass through the plurality of conductive pads and space the plurality of conductive pads from each other;
a barrier pattern on the plurality of conductive pads and the insulating pattern;
a bit line contact pattern configured to pass through the plurality of conductive pads and the insulating pattern on the substrate, the bit line contact pattern electrically connected to the substrate;
a storage node contact in contact with the plurality of conductive pads;
a lower spacer structure configured to space the bit line contact pattern and the plurality of conductive pads apart from each other, an upper end of the lower spacer structure on a level lower than a level of upper surfaces of the plurality of conductive pads; and
an upper spacer structure configured to space the bit line contact pattern and the storage node contact apart from each other wherein the upper spacer structure extends under and contacts a bottom surface of the storage node contact.

20. The semiconductor device of claim 19, wherein the upper end of the lower spacer structure is lower than a level of a lower end of the storage node contact.

* * * * *